United States Patent
Lee et al.

(10) Patent No.: US 9,867,256 B2
(45) Date of Patent: Jan. 9, 2018

(54) DISPLAY SYSTEM AND SELF-CHECKING METHOD OF THE DISPLAY SYSTEM

(71) Applicant: SAMSUNG ELECTRONICS CO., LTD., Suwon-si (KR)

(72) Inventors: Sung-han Lee, Hwaseong-si (KR); Kun-sok Kang, Suwon-si (KR); Chang-won Son, Seoul (KR); Sang-on Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/259,603

(22) Filed: Sep. 8, 2016

(65) Prior Publication Data

US 2017/0208655 A1 Jul. 20, 2017

(30) Foreign Application Priority Data

Jan. 14, 2016 (KR) .................. 10-2016-0004828

(51) Int. Cl.
*H05B 33/08* (2006.01)
*G01R 1/30* (2006.01)
(Continued)

(52) U.S. Cl.
CPC .............. *H05B 33/089* (2013.01); *G01R 1/30* (2013.01); *G01R 19/16576* (2013.01); *G01R 31/44* (2013.01); *H05B 33/0842* (2013.01)

(58) Field of Classification Search
CPC ........... H05B 33/0803; H05B 33/0815; H05B 33/0818; H05B 33/0827; H05B 33/089; H05B 33/0893; H05B 33/0842; H05B 33/0848; H05B 37/02; H05B 37/03; H05B 37/036; H05B 37/04; Y02B 20/42; Y02B 20/46; G01R 1/30; G01R 19/16576; G01R 31/44
(Continued)

(56) References Cited

U.S. PATENT DOCUMENTS 5,805,062 A * 9/1998 Pearlman ............... H03F 3/085
340/508
6,865,458 B1 3/2005 Kim
(Continued)

FOREIGN PATENT DOCUMENTS

KR 10-0780601 B1 11/2007
KR 10-2009-0017226 A 2/2009
(Continued)

*Primary Examiner* — Haissa Philogene
(74) *Attorney, Agent, or Firm* — Sughrue Mion, PLLC

(57) ABSTRACT

Provided is a light-emitting diode (LED) driving system. The LED driving system includes an LED current controller, a detector, and a system controller. The LED current controller is configured to control a current flowing through a plurality of LED arrays including at least one LED, such that no current flows through a first LED array from among the plurality of the LED arrays and a current flows through a second LED array from among the plurality of the LED arrays. The detector is configured to detect a sensing voltage from the first LED array. The system controller is configured to determine, based on a comparison result between the sensing voltage and a reference voltage, a failure of the at least one LED included in the second LED array.

18 Claims, 18 Drawing Sheets

(51) Int. Cl.
*G01R 19/165* (2006.01)
*G01R 31/44* (2006.01)

(58) Field of Classification Search
USPC ............ 315/185 S, 247, 291, 307, 312, 360
See application file for complete search history.

(56) References Cited

U.S. PATENT DOCUMENTS

| | | | |
|---|---|---|---|
| 7,777,430 B2 * | 8/2010 | Catalano | H05B 33/0803 |
| | | | 315/185 S |
| 7,876,103 B2 * | 1/2011 | Mihai | H05B 33/089 |
| | | | 315/129 |
| 7,948,227 B2 | 5/2011 | Beckmann | |
| 8,081,199 B2 * | 12/2011 | Takata | G09G 3/342 |
| | | | 345/102 |
| 8,952,622 B2 * | 2/2015 | Lee | H05B 33/0851 |
| | | | 315/244 |
| 9,218,110 B2 * | 12/2015 | Morotomi | H04M 1/72522 |
| 9,253,837 B1 * | 2/2016 | Hong | H05B 33/083 |
| 9,549,442 B1 * | 1/2017 | Bong | H05B 33/0845 |
| 2010/0141162 A1 * | 6/2010 | Matsumoto | H05B 33/0818 |
| | | | 315/186 |
| 2012/0098448 A1 * | 4/2012 | Kang | H05B 33/083 |
| | | | 315/201 |
| 2016/0227616 A1 * | 8/2016 | Lee | H05B 33/0815 |

FOREIGN PATENT DOCUMENTS

| | | |
|---|---|---|
| KR | 10-2012-0037768 A | 4/2012 |
| KR | 10-1548351 B1 | 8/2015 |

\* cited by examiner

| FIRST DISPLAY MODULE (1501-1) | SECOND DISPLAY MODULE (1501-2) | THIRD DISPLAY MODULE (1501-3) |
|---|---|---|
| FOURTH DISPLAY MODULE (1501-4) | FIFTH DISPLAY MODULE (1501-5) | SIXTH DISPLAY MODULE (1501-6) |
| SEVENTH DISPLAY MODULE (1501-7) | EIGHTH DISPLAY MODULE (1501-8) | NINTH DISPLAY MODULE (1501-9) |

FIG. 17
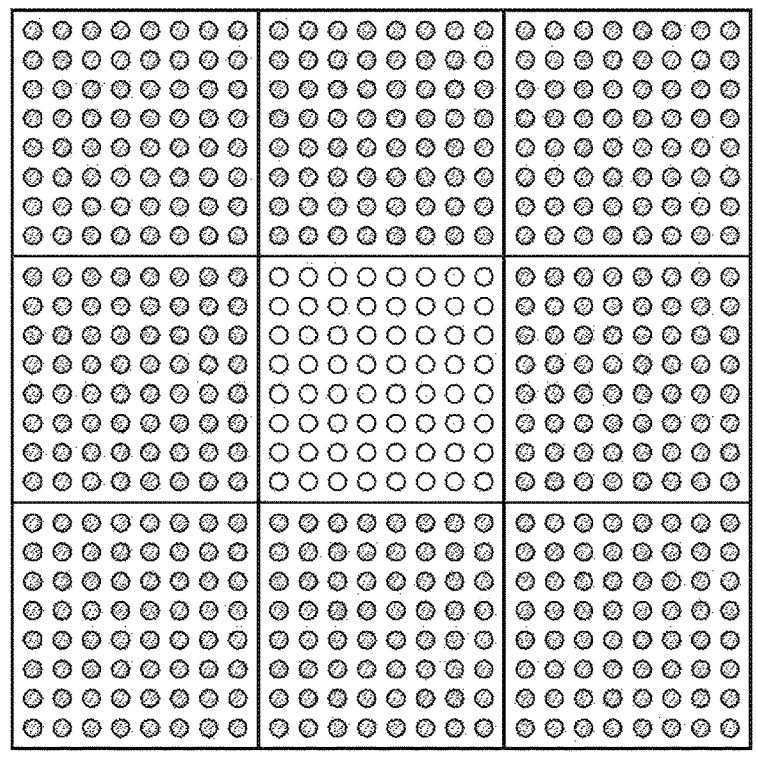
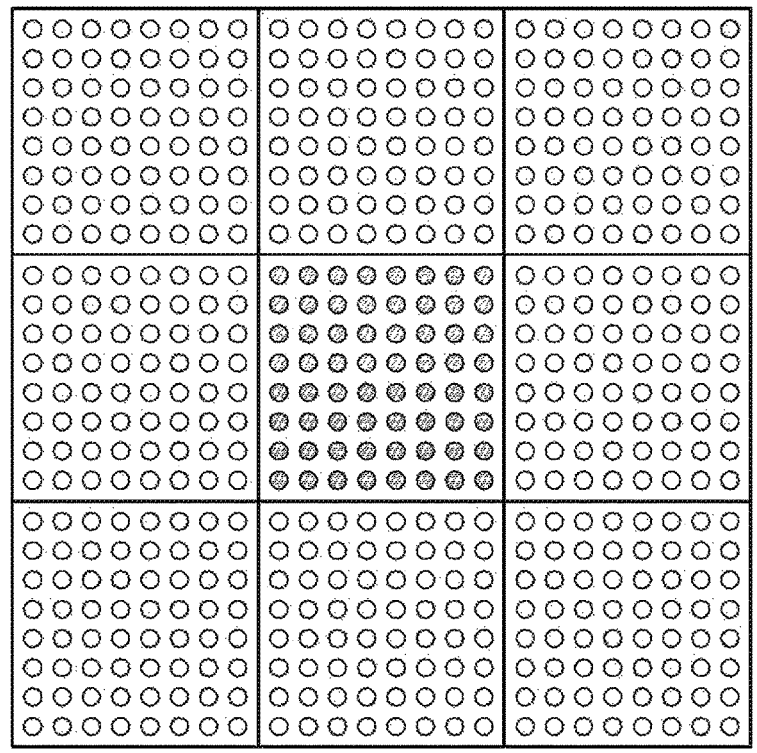

DISPLAY SYSTEM AND SELF-CHECKING METHOD OF THE DISPLAY SYSTEM

CROSS-REFERENCE TO RELATED APPLICATION

This application claims priority from Korean Patent Application No. 10-2016-0004828, filed on Jan. 14, 2016, in the Korean Intellectual Property Office, the disclosure of which is incorporated herein by reference in its entirety.

BACKGROUND

1. Field

Exemplary embodiments relate to a display system and a method of performing a self-check by the display system.

2. Description of the Related Art

Display devices have a function of providing images to users. In addition to an image providing function, display devices provide various functions for the user's convenience. As display devices provide higher-resolution images and more functions for the user's convenience, the display devices consume more power. In particular, large display devices and mobile display devices such as smart phones, tablet personal computers (PCs), or laptop computers use various technologies for reducing power consumption.

A display may include at least one of a liquid crystal display (LCD), a thin film transistor-liquid crystal display (TFT-LCD), an organic light-emitting diode (OLED), a plasma display panel (PDP), and a quantum dot LED (QLED).

A light-emitting diode (LED) may represent a color by using a self-luminous phenomenon that emits a light when a current flows through a fluorescent organic compound. However, in the case of using an LED, when a particular screen is driven in a fixed state for a long time, the brightness of a display screen may decrease due to routine device degradation.

SUMMARY

Provided are a light-emitting diode (LED) driving system and an LED checking method implemented in the LED driving system.

Additional aspects will be set forth in part in the description which follows and, in part, will be apparent from the description, or may be learned by practice of the presented exemplary embodiments.

According to an aspect of an exemplary embodiment, an LED driving system includes: an LED current controller configured to control a current flowing through a plurality of LED arrays, each of which includes at least one LED, such that no current flows through a first LED array among the plurality of the LED arrays and a current flows through a second LED array among the plurality of the LED arrays; a detector configured to detect a sensing voltage from the first LED array; and a system controller configured to determine, based on a comparison result between the sensing voltage and a reference voltage, a failure of the at least one LED included in the second LED array.

The LED current controller may include a switch configured to control a bias applied to the first LED array and the second LED array.

The system controller may determine the first LED array and the second LED array among the plurality of the LED arrays according to a predetermined pattern.

The sensing voltage may include a photovoltaic voltage caused by a light wave received from the at least one LED included in the second LED array.

The detector may include a comparator configured to output the comparison result based on a difference between the sensing voltage and the reference voltage.

The comparator may include an amplifier, wherein the amplifier may include a first input terminal configured to receive the sensing voltage and a second input terminal configured to receive the reference voltage, and the amplifier may output an amplified comparison result by amplifying the difference between the sensing voltage and the reference voltage.

The reference voltage may include a previously-detected sensing voltage.

The system controller may provide a user interface including notification information in response to the failure of the at least one LED included in the second LED array.

The LED current controller may control the at least one LED included in the second LED array to emit a red light, a green light, a blue light, and/or any combination thereof.

The system controller may be spaced apart from the LED current controller and the detector.

According to an aspect of another exemplary embodiment, an LED driving system includes: a first LED array including at least one LED; a second LED array including at least one LED; an LED current controller configured to control a current flowing through the first LED array and the second LED array; and a detector configured to detect a first sensing voltage from the first LED array when no current flows through the first LED array, and to detect a second sensing voltage from the second LED array when no current flows through the second LED array, wherein the LED current controller adjusts an amount of a current flowing through the first LED array or a current flowing through the second LED array, based on a comparison result between the first sensing voltage and the second sensing voltage.

According to an aspect of another exemplary embodiment, an LED checking method implemented in an LED driving system includes: controlling a current flowing through a plurality of LED arrays, each of which includes at least one LED, such that no current flows through a first LED array among the plurality of the LED arrays and a current flows through a second LED array among the plurality of the LED arrays; detecting a sensing voltage from the first LED array; and determining, based on a comparison result between the sensing voltage and a reference voltage, a failure of the at least one LED included in the second LED array.

According to an aspect of another exemplary embodiment, an LED checking method implemented in an LED driving system includes: controlling a current flow such that no current flows through a first LED array including at least one LED and such that a current flows through a second LED array including at least one LED; detecting a first sensing voltage from the first LED array; controlling the current flow such that a current flows through the first LED array and no current flows through the second LED array; detecting a second sensing voltage from the second LED array; and adjusting an amount of a current flowing through the first LED array or a current flowing through the second LED array, based on a comparison result between the first sensing voltage and the second sensing voltage.

According to an aspect of another exemplary embodiment, a non-transitory computer-readable recording medium stores a program that performs the above LED checking method when executed by a computer.

BRIEF DESCRIPTION OF THE DRAWINGS

These and/or other aspects will become apparent and more readily appreciated from the following description of exemplary embodiments, taken in conjunction with the accompanying drawings in which:

FIG. 17 illustrates an example of patterns applied to display modules by a management server;

DETAILED DESCRIPTION

Figure 1:
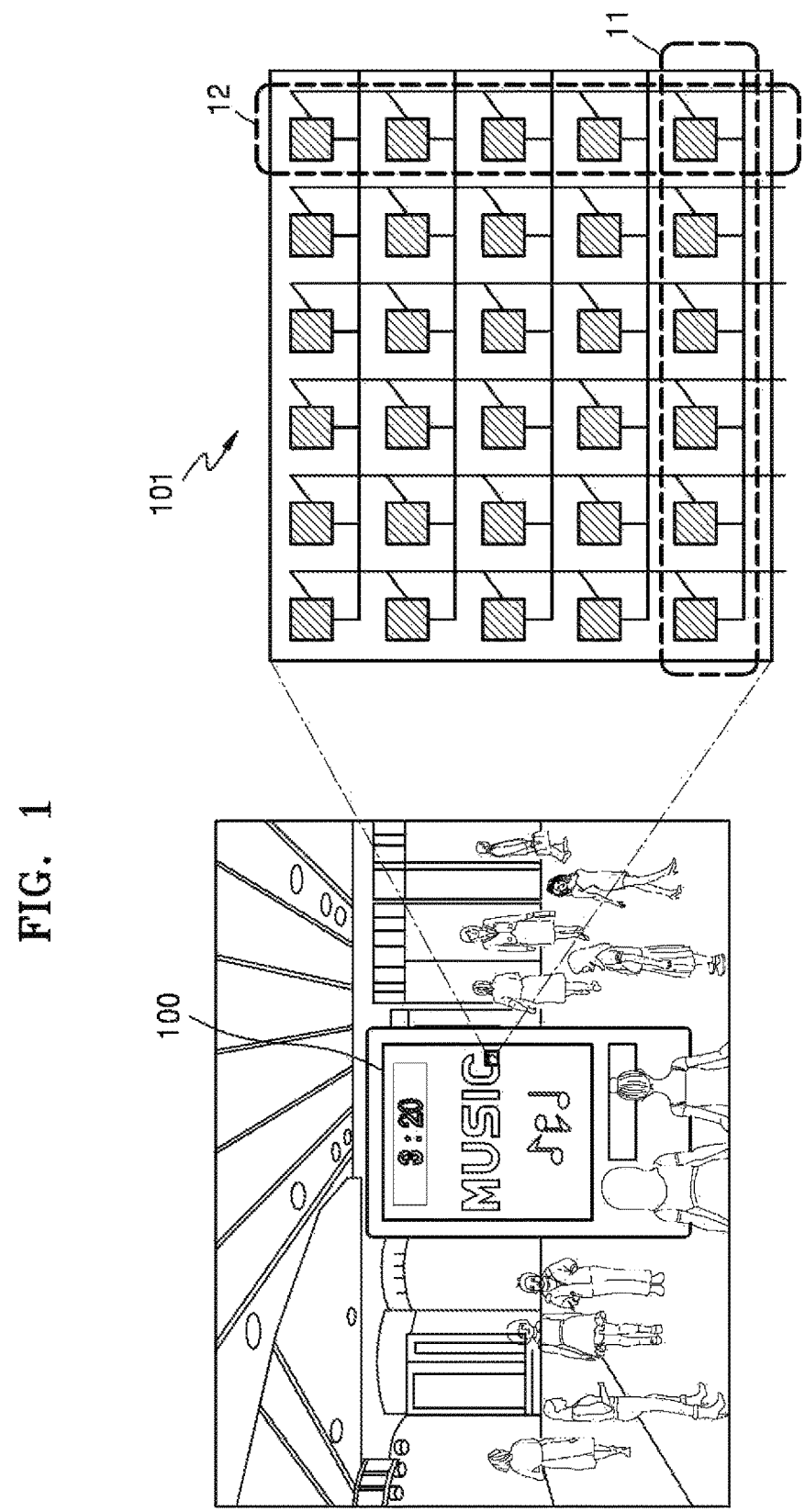
FIG. 1 is a diagram illustrating a display system, according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terms used in the specification will be briefly described, and then the exemplary embodiments will be described in detail.

The terms used in this specification are those general terms currently widely used in the art in consideration of functions in regard to the exemplary embodiments, but the terms may vary according to the intention of those of ordinary skill in the art, precedents, or new technology in the art. Also, specified terms may be selected by the applicant, and in this case, the detailed meaning thereof will be described in the detailed description of the exemplary embodiments. Thus, the terms used in the specification should be understood not as simple names but based on the meaning of the terms and the overall description of the exemplary embodiments.

Although terms such as "first" and "second" may be used herein to describe various elements or components, the elements or components should not be limited by the terms. These terms are only used to distinguish one element or component from another element or component. For example, a first element or component may also be referred to as a second element or component, and vice versa. As used herein, the term "and/or" includes any and all combinations of one or more of the associated listed items.

When something "comprises" or "includes" a component, another component may be further included unless specified otherwise. Also, the term "unit" used herein means a software component or a hardware component such as a field-programmable gate array (FPGA) or an application-specific integrated circuit (ASIC), and the "unit" performs some functions. However, the "unit" is not limited to software or hardware. The "unit" may be formed so as to be in an addressable storage medium, or may be formed so as to operate one or more processors. Thus, for example, the "unit" may include components such as software components, object-oriented software components, class components, and task components, and may include processes, functions, attributes, procedures, subroutines, segments of program code, drivers, firmware, micro codes, circuits, data, a database, data structures, tables, arrays, and variables. A function provided by the components and "units" may be associated with the smaller number of components and "units", or may be divided into additional components and "units".

Hereinafter, exemplary embodiments of the present inventive concept will be described in detail with reference to the accompanying drawings so that those of ordinary skill in the art may easily implement the exemplary embodiments. In this regard, the present exemplary embodiments may have different forms and should not be construed as being limited to the descriptions set forth herein. In addition, portions irrelevant to the description of the exemplary embodiments will be omitted in the drawings for a clear description of the exemplary embodiments, and like reference numerals will denote like elements throughout the specification.

FIG. 1 is a diagram illustrating a display system 100. The display system 100 may visually represent image data.

As illustrated in FIG. 1, the display system 100 may include, for example, a large format display (LFD). Also, in addition to the illustrated type, the display system 100 may include various other types of display devices. For example, the display system 100 may include a portable terminal such as a tablet terminal or a smart phone and may also include a personal computer (PC) monitor and a television (TV) monitor.

According to an exemplary embodiment, a display panel 101 included in the display system 100 may include, for example, a light-emitting diode (LED). The LED may represent a color by using a self-luminous phenomenon that emits a light when a current flows through a compound. For example, the LED of the display system 100 may include an organic LED (OLED) or a quantum dot LED (QLED).

The display panel 101 may include a plurality of LEDs for representing image data, and the LEDs may be arranged in a matrix form. The LEDs of the display system 100 may be controlled in units of rows or columns. Hereinafter, row-unit LEDs 11 or column-unit LEDs 12 controlled by the display system 100 will be referred to as an LED array. However, the exemplary embodiments are not limited thereto, and the LED array may also refer to LEDs that are arranged diagonally in the display panel 101.

As for the LEDs of the display system 100, the light output thereof may decrease as the accumulated light-emitting time thereof increases. Herein, the accumulated light-emitting time may refer to the total sum of light-emitting times of the LEDs after the production of the display system 100. The LED has a higher energy efficiency than other light-emitting elements. However, since most of the energy used to drive the LED is converted into thermal energy, the light output of the LED may decrease due to degradation. In particular, when the screen is driven in a fixed state for a long time, the brightness of the display system 100 may decrease due to a decrease in the light output of the LEDs.

Figure 2:
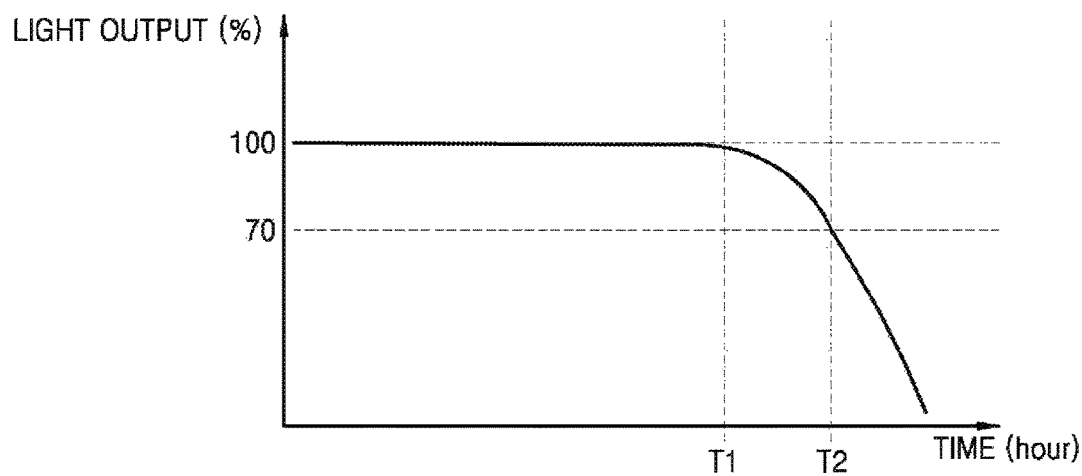
FIG. 2 is a diagram illustrating a light output change that varies based on the accumulated light-emitting time in LEDs.

FIG. 2 is a diagram illustrating a light output change which varies based on the accumulated light-emitting time in LEDs.

As illustrated in FIG. 2, the LED is a solid light-emitting element which is capable of operating for a longer time (e.g., 1,000,000 hours or more) than other light-emitting elements, but its light output deceases rapidly after a certain time T1. Thus, a user of the display system 100 may need to perform an operation for repairing or replacing the display system 100 when it reaches a time T2 at which the light output of all or some LEDs of the display panel 101 decreases to a certain level or below in comparison with the initial light output thereof. However, for example, the time T1 after which the light output decreases rapidly and the time T2 at which the light output decreases to a certain level or below may vary according to the types of image data and/or the surrounding environments of the display system 100. Accordingly, it may be difficult for the user of the display system 100 to predict the time to replace or repair the display panel 101.

Hereinafter, a description will be provided of an operation of the display system 100 for controlling the LED array to check the LED light output and providing a user interface for notifying the time to replace or repair the display panel 101 to the user according to the check result.

Figure 3:
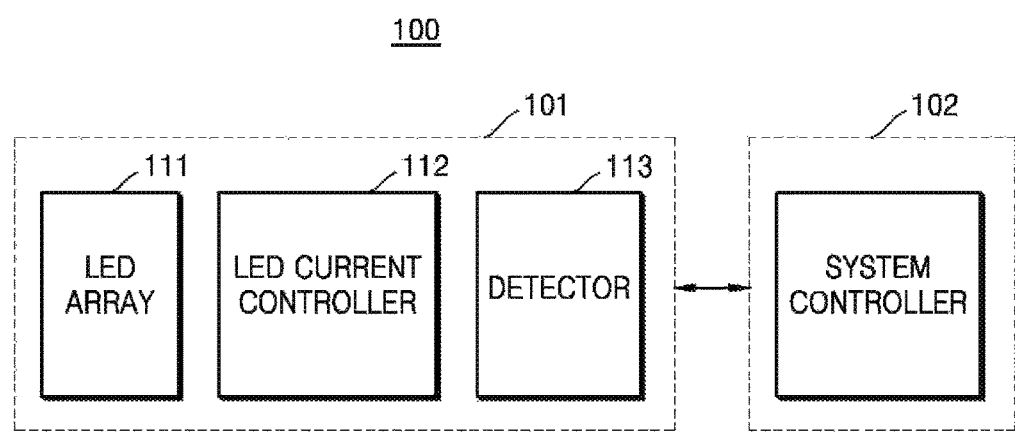
FIG. 3 is a diagram illustrating a configuration of a display system, according to an exemplary embodiment.

FIG. 3 is a diagram illustrating a configuration of a display system 100, according to an exemplary embodiment.

Referring to FIG. 3, the display system 100 may include a display panel 101 and a system controller 102. Also, the display panel 101 may include an LED array 111 which includes at least one LED, an LED current controller 112, and a detector 113.

According to an exemplary embodiment, the LED current controller 112 may include at least one component that is connected to the LED array 111 and is configured to output a current to the LED array 111. For example, the LED current controller 112 may include any of a non-isolated buck converter, a boost converter, a buck-boost converter, an isolated fly-back converter, a forward converter, and/or a half-bridge converter and may also include a converter controller for controlling at least one converter.

Also, the LED current controller 112 may further include at least one component which is configured for controlling the dimming of the LED array 111. For example, the LED current controller 112 may further include a hardware and/or software component according to an analog (or linear) current control mode, a pulse width modulation (PWM) mode, or a frequency modulation (FM) mode. However, the exemplary embodiments are not limited thereto, and the LED current controller 112 may include any of various components which are configured for outputting a current to the LED array 111.

Also, the LED current controller 112 may include a switch unit (not illustrated) for controlling a current output to the LED array 111. For example, the switch unit (not illustrated) may be disposed between the LED array 111 and a power supply to control a bias voltage applied to the LED array 111. The switch unit (not illustrated) may turn on or off a switch to apply a forward bias or a zero bias to the LED array 111.

For example, the switch unit (not illustrated) may turn off a switch to perform control such that no current may flow through a first LED array. Also, the switch unit (not illustrated) may turn on a switch such that a current may flow through a second LED array. In this case, since the LEDs included in the first LED array are in a zero-bias state, they may function as a light-receiving element sensing a light. Thus, a sensing voltage may be generated in the LEDs included in the first LED array. Herein, the sensing voltage may be a photovoltaic voltage (or photovoltage) caused by a light wave (i.e., light energy) generated by at least one LED included in the second LED array emitting a light. However, the exemplary embodiments are not limited thereto, and the switch unit (not illustrated) may also control a switch to apply a reverse bias to the LED array 111. In this case, a photoconductive sensing voltage may be generated in the LEDs of the first LED array.

The first LED array and the second LED array may be adjacent to each other. For example, the first LED array and the second LED array may be disposed successively on the display panel 101. However, the exemplary embodiments are not limited thereto, and the first LED array and the second LED array may also be disposed with at least one other LED array therebetween on the display panel 101.

According to an exemplary embodiment, the detector 113 may detect a sensing voltage generated by at least one LED included in the LED array 111. For example, the detector 113 may detect a sensing voltage (e.g., 0.05 V to 0.8 V) in accordance with a potential difference which is generated between an anode and a cathode of the LED.

Also, when detecting a sensing voltage, the detector 113 may provide an output signal based on the sensing voltage to the system controller 102. For example, the detector 113 may provide a sensing voltage or an amplified sensing voltage as an output signal to the system controller 102.

Alternatively, the detector 113 may further include a component which is configured for comparing a sensing voltage with a reference voltage. Herein, the reference voltage may refer to a predetermined value for determining whether the light output from the second LED array through which a current flows (or which emits a light) decreases to a predetermined level or below. Alternatively, the reference voltage may be equal to a previously-detected sensing voltage. Specifically, the detector 113 may further include a comparator (not illustrated) having input terminals receiving the sensing voltage and the reference voltage. A case where the detector 113 includes the comparator (not illustrated) will be described below in detail with reference to FIG. 4.

According to an exemplary embodiment, the display panel 101 may be configured as a touch screen by forming a layer structure with a touch pad. In this case, the display panel 101 may be used not only as an output device but also as an input device.

According to an exemplary embodiment, the system controller 102 may control an overall operation of the display system 100. For example, the system controller 102 may control an operation of the display panel 101. Also, the system controller 102 may provide any of various user interfaces.

The system controller 102 may control the display panel 101 according to a predetermined pattern. Herein, the pattern may include information about whether to provide a current to the LED array 111 included in the display panel 101 or information about a current provided to the LED array 111. For example, the pattern may be stored in the display system 100 in the form of a set that has as many elements as the number of LED arrays included in the display panel 101. Thus, according to the predetermined pattern, the system controller 102 may determine the first LED array through which no current flows and the second LED array through which a current flows.

Also, based on the output signal received from the detector 113, the system controller 102 may determine a failure or not of at least one LED included in the second LED array. Herein, the failure or not of the LED may represent whether the light output of the LED decreases rapidly (exponentially). Also, the failure or not of the LED may represent whether the light output of the LED decreases to a certain level or below in comparison with the initial light output thereof.

According to an exemplary embodiment, the system controller 102 may receive the sensing voltage as the output signal and acquire a comparison result between the output signal and the reference voltage. Herein, the reference voltage may be a previously-received sensing voltage or a predetermined value as described above. Also, the comparison result may be a difference between the output signal and the reference voltage. Based on the comparison result, the system controller 102 may determine whether there is a failure in at least one LED of the second LED array. Alternatively, the system controller 102 may receive a comparison result between the sensing voltage and the reference voltage as the output signal. In this case, based on the received output signal, the system controller 102 may determine whether there is a failure in at least one LED of the second LED array. An operation of the system controller 102 for determining the failure or not of the LED will be described below in detail with reference to FIGS. 12A and 12B.

When determining that there is a failure in at least one LED included in the second LED array, the system controller 102 may perform an additional check on the display panel 101 or provide a user interface which includes notification information indicating that there is a problem in the display panel 101. Performing an additional check on the display panel 101 by the system controller 102 may refer to individually checking each LED included in the second LED array. Specifically, the system controller 102 may select a particular pattern for individually checking each LED included in the second LED array and control the display panel 101 according to the selected pattern. Also, the system controller 102 may provide a user interface representing the failure level (e.g., a light output decrease of 40%) and position information of the second LED array in which a failure is detected.

Also, when there is no failure in the second LED array, the system controller 102 may repeat the above operation after changing the first LED array and the second LED array according to another pattern. Thus, the system controller 102 may check whether there is a failure in at least one LED included in the LED array 111.

Also, in order to monitor the light output of the LED array 111, the system controller 102 may perform the above operations repeatedly at predetermined time intervals. For example, the system controller 102 may monitor the light output of the LED array 111 by setting the LED array 111 to emit or receive a light for a predetermined time period at intervals of 24 hours.

Also, the system controller 102 may determine the failure or not of the LED array 111 in consideration of the surrounding environment of the display panel 101. For example, when a light-emitting object is located near the display panel 101, the system controller 102 may delay the above operation until the light-emitting object is removed therefrom.

The system controller 102 may be implemented in the form of being combined with the display panel 101, or may be located in another place separately from the display panel 101. When the system controller 102 is located in another place separately from the display panel 101, the system controller 102 and the display panel 101 may communicate via a wired network and/or a wireless network.

In addition, although it has been described above that the LEDs included in the display panel 101 are controlled in units of rows or columns, the exemplary embodiments are not limited thereto. The above exemplary embodiment may also be applied to control each of the LEDs. In this case, the LED current controller 112 may control the current flowing through each LED, and the detector 113 may detect the sensing voltage generated in each LED.

Figure 4:
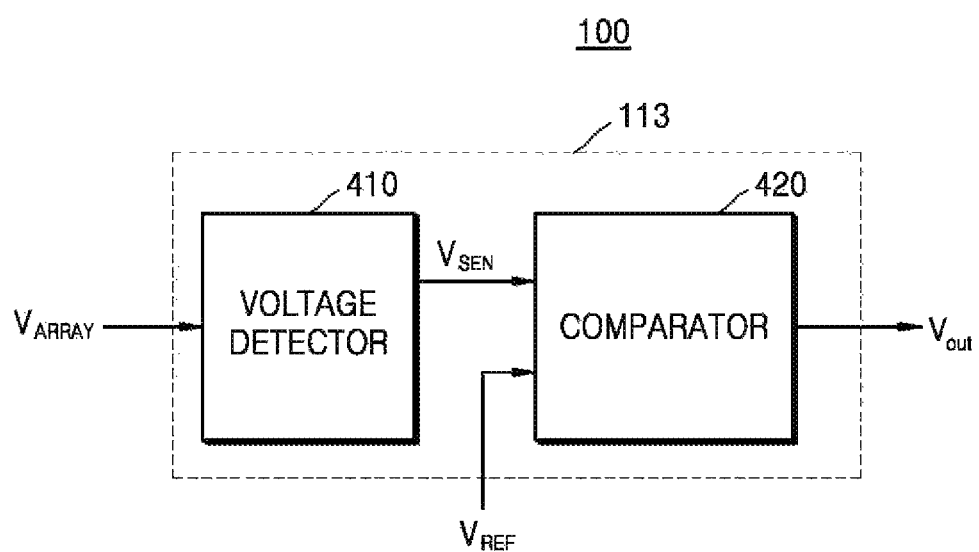
FIG. 4 is a diagram illustrating a detector, according to an exemplary embodiment.

FIG. 4 is a diagram illustrating a detector 113, according to an exemplary embodiment.

Referring to FIG. 4, the detector 113 may include a voltage detector 410 and may further include a comparator 420, according to an exemplary embodiment.

The voltage detector 410 may include at least one component configured for detecting a voltage that is lower or higher than a predetermined voltage. For example, the voltage detector 410 may include a resistor unit (not illustrated) which includes at least one resistor.

The voltage detector 410 may be connected to the LED array 111 to detect a voltage that is lower than a predetermined voltage. For example, the voltage detector 410 may detect a voltage that is lower than 1 V. Thus, the voltage detector 410 may detect a sensing voltage Vsen from the LED array 111 through which no current flows.

The comparator 420 may generate an output signal Vout based on a comparison result Vcomp between a reference voltage Vref and a sensing voltage Vsen detected from the voltage detector 410. Also, the comparator 420 may provide the output signal Vout to the system controller 102.

Also, the comparator 420 may further include an amplifier (not illustrated) that may amplify a difference between the input signals input to the comparator 420. The comparator 420 may generate the output signal Vout by amplifying the comparison result Vcomp by the amplifier (not illustrated). In this manner, by providing the amplified output signal Vout to the system controller 102, the detector 113 may prevent the output signal Vout from being lost during the communication with the system controller 102.

Alternatively, the comparator 420 may provide a predetermined value as an output signal according to the difference between the input signals. For example, when a difference between the detected sensing voltage Vsen and the reference voltage Vref is smaller than a threshold value, the comparator 420 may provide a predetermined value (e.g., '0') indicating that there is no failure, as an output signal. Thus, only when the difference between the sensing voltage Vsen and the reference voltage Vref is greater than the threshold value, the comparator 420 may provide the output signal Vout obtained by amplifying the comparison result Vcomp.

Also, the comparator 420 may include a multiplexer (not illustrated) in order to identify the LED array in which the sensing voltage Vsen is generated.

Also, the comparator 420 may further include a capacitor. Thus, the comparator 420 may also generate the output signal Vout based on the comparison result Vcomp between the reference voltage Vref and an average sensing voltage Vavg_sen detected for a certain time period.

The generated output signal Vout may be provided to the system controller 102.

According to an exemplary embodiment, when the detector 113 does not include the comparator 420, the detector 113 may provide the sensing voltage Vsen as the output signal Vout to the system controller 102. In this case, the voltage detector 410 may further include an amplifier (not illustrated) to provide an amplified sensing voltage Vsen as the output signal Vout to the system controller 102.

Also, according to another exemplary embodiment, the output signal Vout may be provided to the LED current controller 112. In this case, based on the output signal Vout, the LED current controller 112 may adjust an amount of a current flowing through the LED array 111. For example, the LED current controller 112 may monitor the output signal Vout. When the output signal Vout decreases, the LED current controller 112 may increase the current flowing through the LED array 111. Alternatively, by comparing the output signal Vout with a threshold value, when the output signal Vout is smaller than the threshold value, the LED current controller 112 may increase the current flowing through the LED array 111.

Also, according to another exemplary embodiment, in order to prevent an excessively large amount of a current flowing through the LED array 111, the voltage detector 410 may be configured to detect a voltage that is higher than a threshold value. In this case, the comparator 420 may be omitted, and the voltage detector 410 may provide the detected voltage to the system controller 102.

Figure 5:
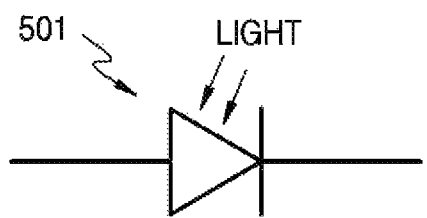
FIG. 5 is a diagram illustrating an LED functioning as a light-receiving element.

FIG. 5 is a diagram illustrating an LED functioning as a light-receiving element.

Referring to FIG. 5, an LED 501 may be a semiconductor element that emits a light when a forward voltage is applied thereto (that is, when forward-biased). The LED 501 may inject minority carriers (electrons or holes) by using a P-N junction structure and emit a light by the recombination of the injected minority carriers. Also, the LED 501 may function as a light-emitting element in a zero-bias state. When a light hits the LED 501, electrons and positive charge holes are generated in the LED 501 and thus a forward-bias current flows therethrough. In this case, the LED 501 may detect a smaller range of light than a general photodiode. In this case, a potential difference generated in the LED 501 (i.e., the intensity of a sensing voltage) may be proportional to the intensity of a light output from a peripheral LED adjacent to the LED 501.

Figure 6A:
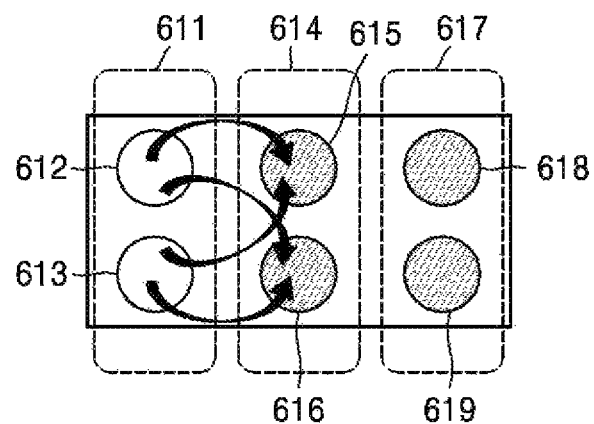
FIGS. 6A and 6B illustrate an example in which an LED functions as a light-receiving element.
Figure 6B:
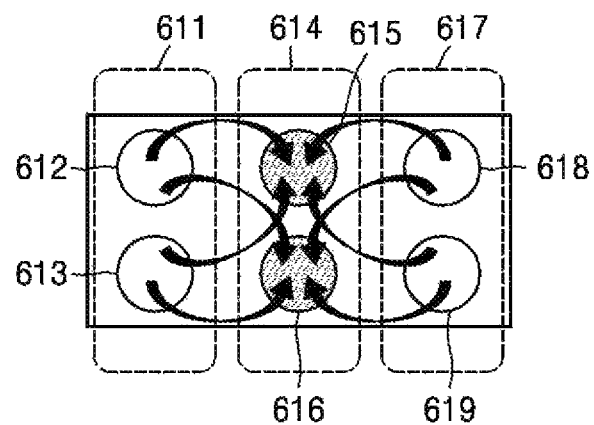

FIGS. 6A and 6B illustrate an example in which an LED functions as a light-receiving element.

Referring to FIG. 6A, the LED current controller 112 may perform control such that a current flows through a first LED array 611 and perform control such that no current flows through second and third LED arrays 614 and 617. Thus, each of a first LED 612 and a second LED 613 included in the first LED array 611 may function as a light-emitting element, and each of third, fourth, fifth, and sixth LEDs 615, 616, 618, and 619 of the second and third LED arrays 614 and 617 may function as a light-receiving element.

A light wave received from the first LED array 611 may be sensed by the second LED array 614. The third LED 615 and the fourth LED 616 of the second LED array 614 may sense light waves received from the first LED 612 and the second LED 613 of the first LED array 611. In this way, one LED may sense light waves generated by two peripheral LEDs.

Also, referring to FIG. 6B, the LED current controller 112 may perform control such that a current flows through the first and third LED arrays 611 and 617 and perform control such that no current flows through the second LED array 614. In this case, each of the first LED 612, the second LED 613, the fifth LED 618, and sixth LED 619 included in the first and third LED arrays 611 and 617 may function as a light-emitting element, and each of the third and fourth LEDs 615 and 616 of the second LED array 614 may function as a light-receiving element.

Light waves received from the first and third LED arrays 611 and 617 may be sensed by the second LED array 614. Thus, the third and fourth LEDs 615 and 616 of the second LED array 614 may sense light waves received from the first and second LEDs 612 and 613 of the first LED array 611 and the fifth and sixth LEDs 618 and 619 of the third LED array 617. In this way, one LED may sense light waves generated by four peripheral LEDs.

As illustrated in FIGS. 6A and 6B, one LED may sense light waves received from two to four peripheral LEDs. However, the exemplary embodiments are not limited thereto, and one LED may sense light waves received from more than four peripheral LEDs. Thus, in order to determine the failure or not of a particular LED array or a particular LED, the system controller 102 may perform control such that the LED arrays emit or receive light according to various patterns.

Figure 7:
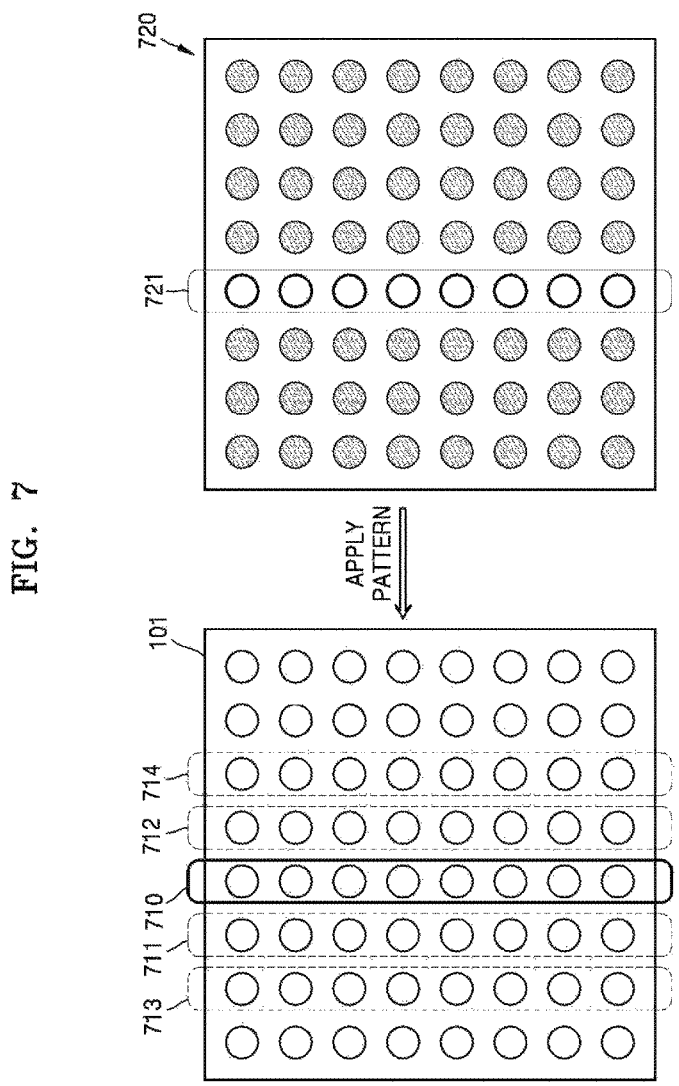
FIG. 7 is a diagram illustrating a pattern for checking a failure or not of a particular LED array.

FIG. 7 is a diagram illustrating a pattern for checking a failure or not of a particular LED array.

Referring to FIG. 7, in order to check a particular LED array 710 of the display panel 101, the system controller 102 may control the display panel 101 based on a pattern 720 illustrated on the right side of FIG. 7. Herein, the pattern may include information about whether to provide a current to each of the LED arrays included in the display panel 101. Also, the pattern may be represented in the form of a set that has as many elements as the number of LED arrays included in the display panel 101. For example, the pattern 720 of FIG. 7 may be represented as '{0,0,0,1,0,0,0,0}', where each column corresponds to an LED array, a "0" is illustrated as a column of shaded circles, and a "1" is illustrated as a column of unshaded circles.

According to the pattern 720 of FIG. 7, the LED current controller 112 may perform control such that a current flows through the particular LED array 710 and perform control such that no current flows through other LED arrays including a first peripheral LED array 711 and a second peripheral LED array 712, each of which is adjacent to the particular LED array 710. In particular, by setting no current to flow through a third peripheral LED array 713 and a fourth peripheral LED array 714 that may affect the first peripheral LED array 711 and the second peripheral LED array 712, the first peripheral LED array 711 and the second peripheral LED array 712 may be set to sense only a light wave emitted from the particular LED array 710.

The detector 113 may detect a sensing voltage from the first peripheral LED array 711 and the second peripheral LED array 712 and provide the detected sensing voltage to the system controller 102. Thus, the system controller 102 may determine whether there is a failure in the light output of the particular LED array 710.

Alternatively, the detector 113 may provide the comparison result between the detected sensing voltage and the reference voltage to the system controller 102. In this case, based on the comparison result received from the display panel 101, the system controller 102 may determine whether there is a failure in the light output of the particular LED array 710.

Figure 8:
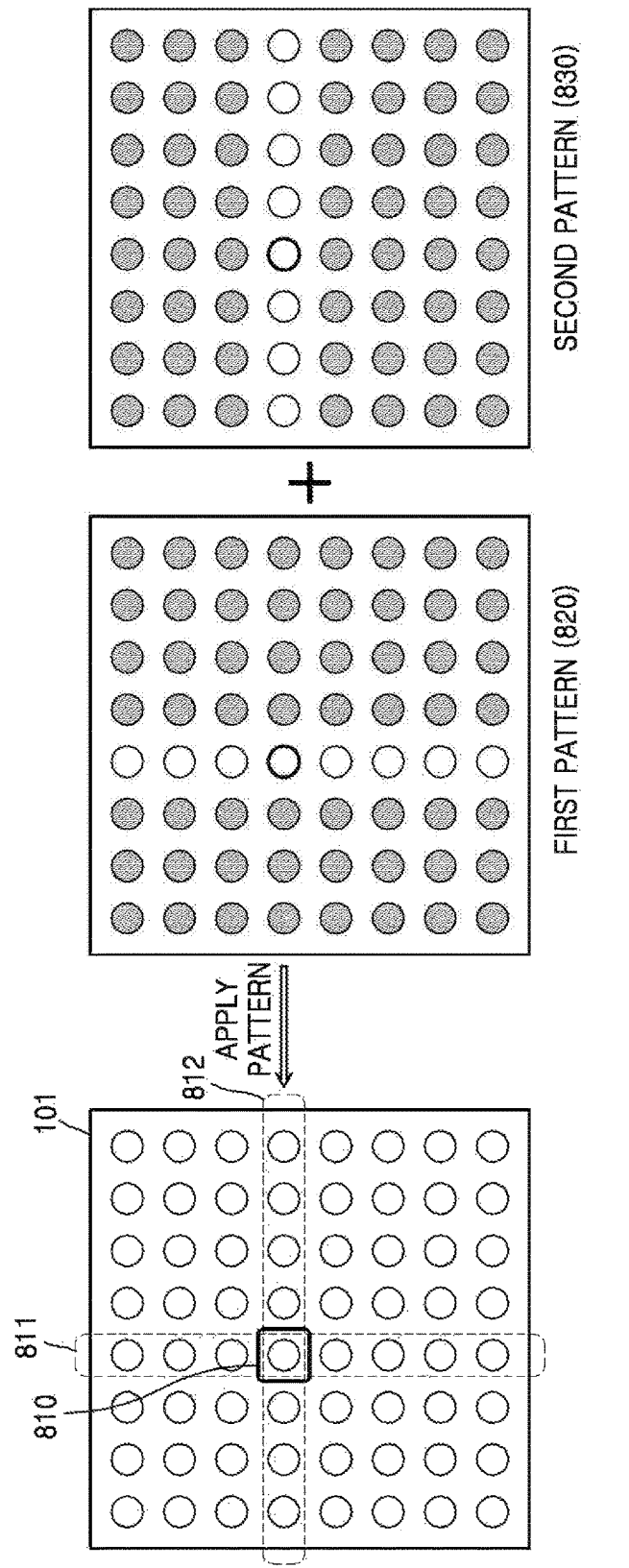
FIG. 8 is a diagram illustrating a pattern for checking a failure or not of a particular LED.

FIG. 8 is a diagram illustrating a pattern for checking a failure or not of a particular LED.

Referring to FIG. 8, the system controller 102 may check a particular LED 810 of the display panel 101. For this purpose, the system controller 102 may control the display panel 101 based on a first pattern 820 and a second pattern 830 illustrated on the right side of FIG. 8. The first pattern 820 and the second pattern 830 may further include information for controlling a column-unit LED array and a row-unit LED array. For example, the first pattern 820 may be represented as '{0,{0,0,0,1,0,0,0,0}}' that is a set including information indicating that the LED array is controlled in units of columns as a first element (i.e., the first element "0" corresponds to an indication that each column represents an LED array). Also, the second pattern 830 may be represented as '{1,{0,0,0,1,0,0,0,0}}' that is a set including information indicating that the LED array is controlled in units of rows as a first element (i.e., the first element "1" corresponds to an indication that each column represents an LED array).

By sequentially applying the first pattern 820 and the second pattern 830 to the display panel 101, the system controller 102 may set the LED current controller 112 such that a current flows through LED arrays 811 and 812, each of which includes the particular LED 810, and such that no current flows through the other LED arrays.

The system controller 102 may determine the failure or not of the LED arrays 811 and 812 including the particular LED 810 based on the comparison result between the reference voltage and the sensing voltage detected according to the first pattern 820 and the second pattern 830.

Also, the system controller 102 may monitor, at predetermined time intervals (e.g., 24 hours or 7 days), the comparison result between the reference voltage and the sensing voltage detected according to the first pattern 820 and the second pattern 830. Accordingly, the system controller 102 may determine whether there is a failure in the light output of the particular LED.

In this way, by setting the LED array 111 of the display panel 101 to emit or receive a light according to various patterns, the display system 100 may be set to self-check the display panel 101. In particular, by applying various patterns to the display panel 101 repeatedly at predetermined time intervals, the display system 100 may monitor whether a failure occurs in the light output of the LEDs, thus enabling the user to take a suitable action at an early stage.

Figure 9:
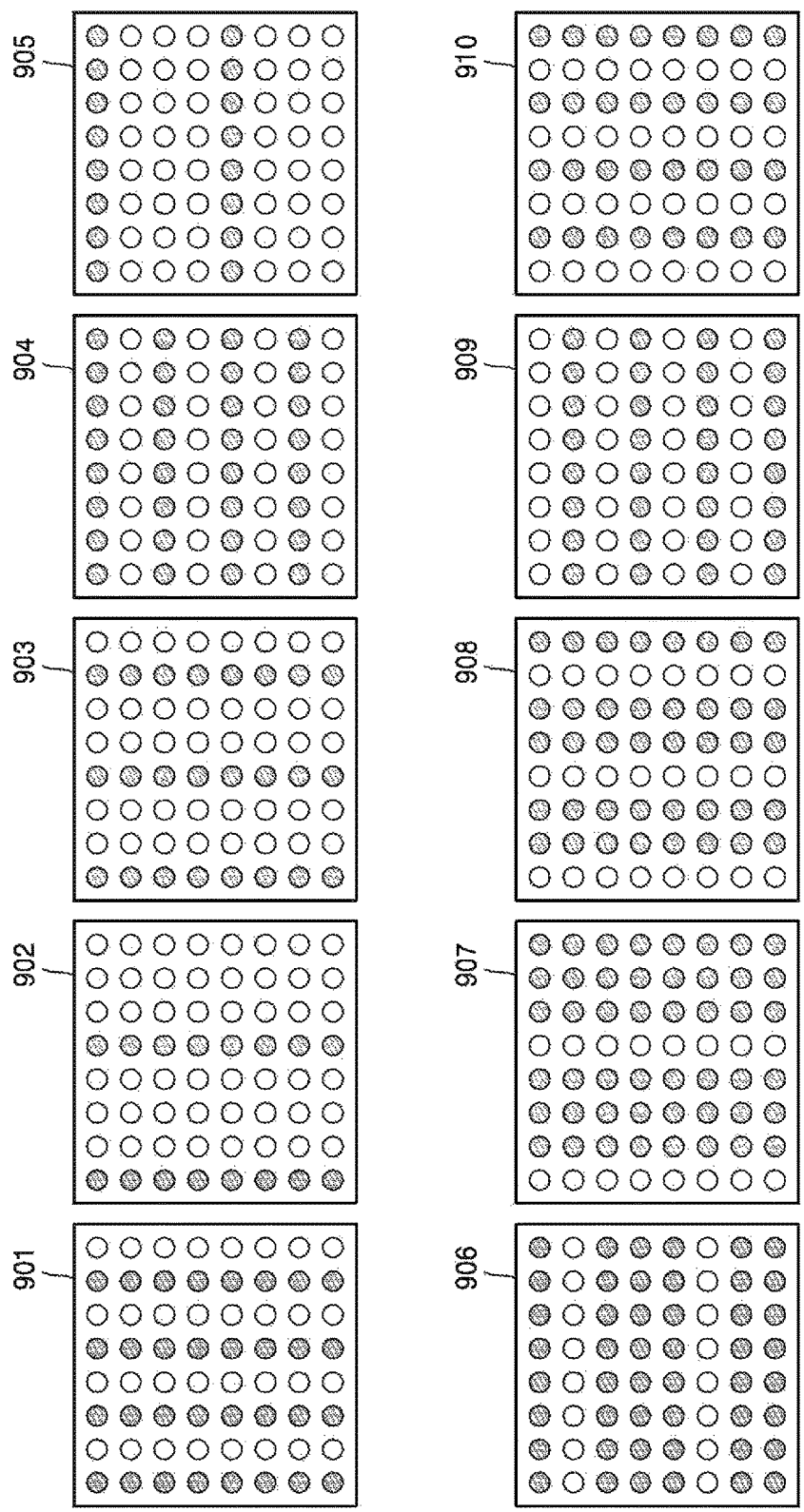
FIG. 9 is a diagram illustrating various patterns.

FIG. 9 is a diagram illustrating various patterns.

As illustrated in FIG. 9, the system controller 102 may select at least one of various patterns 901, 902, 903, 904, 905, 906, 907, 908, 909, 910, control the display panel 101 according to the selected pattern, and determine the failure or not of a particular LED array according to the output signal from the display panel 101.

Also, the system controller 102 may sequentially apply the patterns 901 to 910 to the display panel 101. Thus, the system controller 102 may perform an overall check on the display panel 101.

According to an exemplary embodiment, the system controller 102 may dynamically change the order of applying the patterns 901 to 910. For example, when detecting a failure in a particular LED array, by changing the order of applying the patterns, the system controller 102 may first determine the failure or not of peripheral LED arrays around the particular LED array in which a failure is detected. Alternatively, when detecting a failure in a particular LED array, by additionally applying a particular pattern, the system controller 102 may determine the failure or not of each of the LEDs included in the particular LED array in which a failure is detected.

The patterns illustrated in FIG. 9 are merely an exemplary embodiment, and those of ordinary skill in the art will easily understand that the system controller 101 may control the display panel 101 based on various patterns other than the patterns illustrated in FIG. 9.

Figure 10:
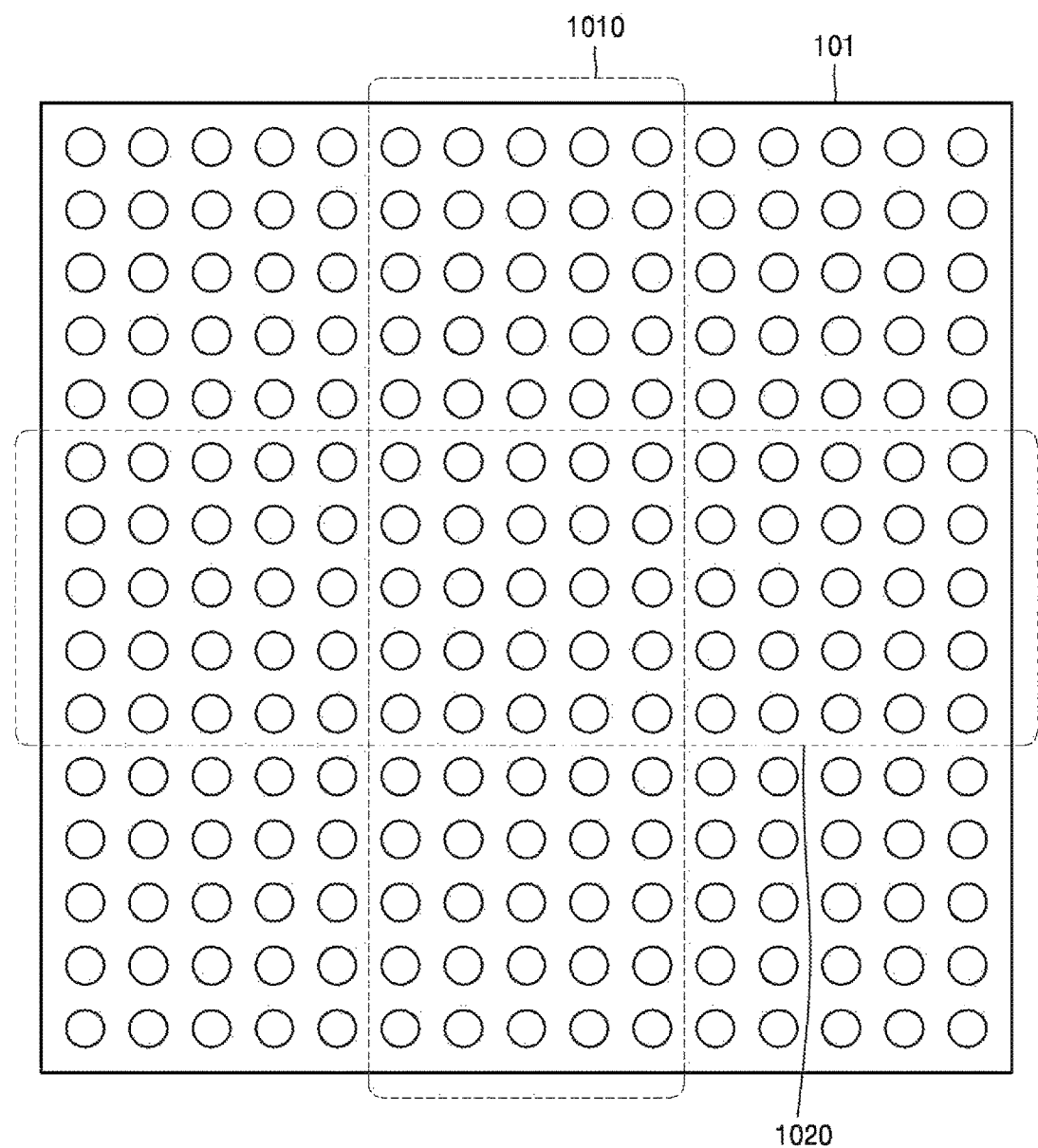
FIG. 10 illustrates an example in which a system controller determines a failure or not of an LED array based on a position at which the LED array is disposed.

FIG. 10 illustrates an example in which the system controller 102 determines a failure or not of an LED array based on a position at which the LED array is disposed.

In general, the display system 100 may provide important information to a center portion of the display panel 101. Thus, the failure or not of the output light of an LED array 1010 or 1020 disposed at a center portion of the display panel 101 (i.e., LED array 1010 is a column-based array, and LED array 1020 is a row-based array) may be more important than the failure or not of the output light of an LED array disposed at a peripheral portion of the display panel 101. Thus, according to an exemplary embodiment, the system controller 102 may determine the failure or not of an LED array differently according to the position of an LED array through which a current flows (that is, which emits a light).

For example, the system controller 102 may determine the failure or not of the output light of the LED array 1010 or 1020 disposed at the center portion of the display panel 101 based on whether the output light thereof is reduced by more than 30% in comparison with the initial output light thereof, and may determine the failure or not of the output light of the LED array disposed at the peripheral portion of the display panel 101 based on whether the output light thereof is reduced by more than 40% in comparison with the initial output light thereof.

Figure 11:
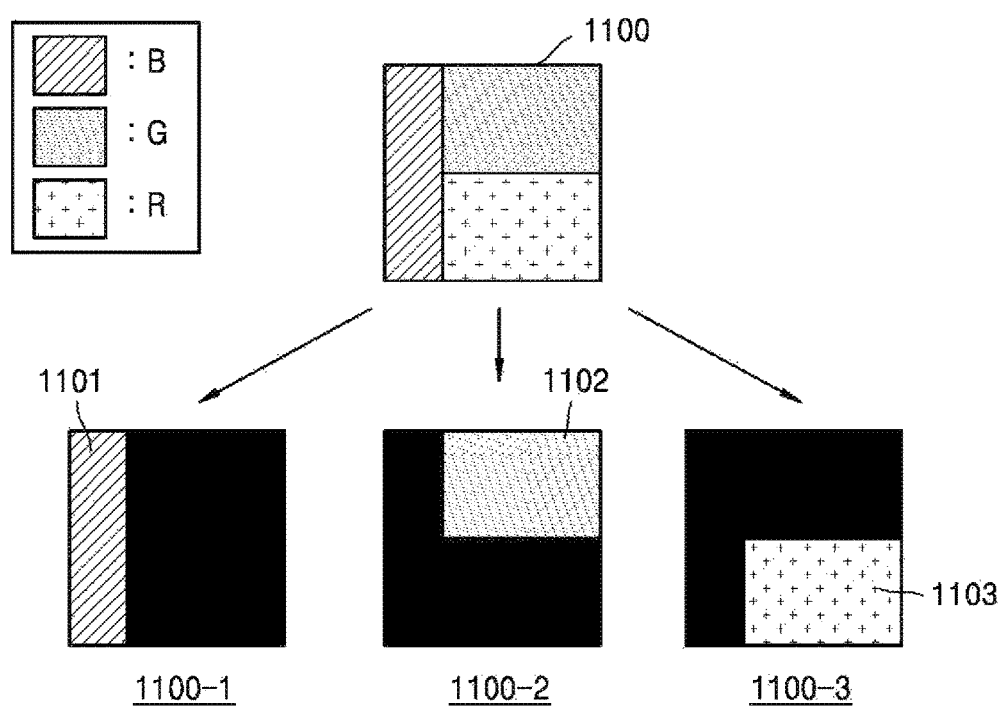
FIG. 11 illustrates an example in which a system controller determines a failure or not of a particular element of an LED.

FIG. 11 illustrates an example in which the system controller 102 determines a failure or not of a particular element of an LED.

Referring to FIG. 11, an LED 1100 may include a plurality of light-emitting elements. For example, the LED 1100 may include a plurality of elements that may represent three colors of red (R), green (G), and blue (B) as illustrated in FIG. 11.

According to an exemplary embodiment, the system controller 102 may control the LED current controller 112 to emit a light by using at least one light-emitting element among a plurality of elements of the LED with respect to the LEDs included in an LED array through which a current flows. Thus, the LED current controller 112 may perform control such that the LEDs included in the second LED array emit light in at least one of red, blue, and green.

For example, as illustrated in 1100-1, the LED current controller 112 may set only a B element 1101 of the LEDs, which are included in the LED array through which a current flows, to emit a light. Alternatively, as illustrated in 1100-2, the LED current controller 112 may set only a G element 1102 of the LEDs to emit a light. Alternatively, as illustrated in 1100-3, the LED current controller 112 may set only an R element 1103 of the LEDs to emit a light. However, the exemplary embodiments are not limited thereto, and the LED current controller 112 may also set the B element 1101 and the G element 1102 of the LED to emit light.

By the above-described operation, the system controller 102 may determine the failure or not of a particular element (e.g., at least one of B element 1101, G element 1102, and R element 1103) of the LED 1100.

Although it has been described above that the LED includes three elements representing three colors, the exemplary embodiments are not limited thereto. For example, the LED may also include a plurality of elements that may represent four colors of red (R), green (G), blue (B), and white (W).

Figure 12A:
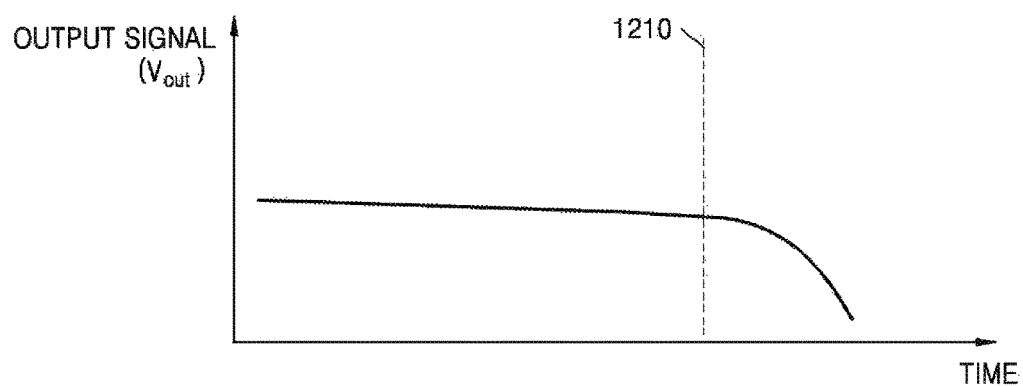
FIG. 12A is a graph illustrating an output signal Vout received by a system controller.

FIG. 12A is a graph illustrating an output signal Vout received by the system controller 102.

Referring to FIG. 12A, the system controller 102 may receive the output signal Vout based on the sensing voltage Vsen of the LED array 111 from the display panel 101 at predetermined time intervals. Thus, the output signal Vout may decrease exponentially after a certain time 1210 corresponding to the time T1 (see FIG. 2) when the light output of the LED decreases rapidly.

According to an exemplary embodiment, the system controller 102 may determine the failure or not of an LED array by comparing the received output signal Vout with a predetermined reference voltage. For example, when the output signal Vout is lower than the reference voltage, the system controller 102 may determine that there is a failure in the LED array.

Alternatively, the system controller 102 may monitor a comparison result Vcomp representing a difference between the received output signal Vout and a reference voltage. In this case, the reference voltage may correspond to a previously-received output signal. Thus, the comparison result Vcomp may be a value that increases rapidly after the certain time 1210 when the output signal Vout decreases exponentially. By monitoring the comparison result Vcomp, when the comparison result Vcomp is greater than a threshold value, the system controller 102 may determine that there is a failure in the LED array.

Figure 12B:
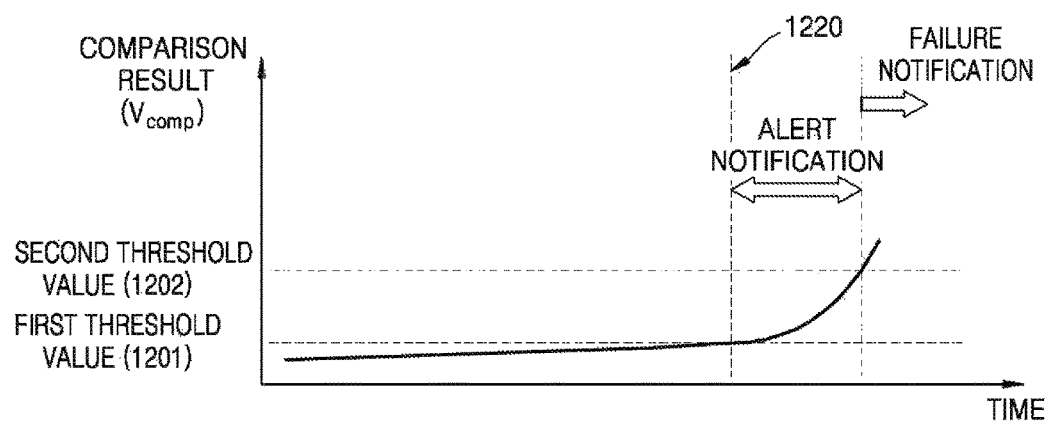
FIG. 12B is a graph illustrating a comparison result Vcomp monitored by a system controller.

FIG. 12B is a graph illustrating a comparison result Vcomp monitored by the system controller 102.

Referring to FIG. 12B, the system controller 102 may compare the comparison result Vcomp with a first threshold value 1201 and a second threshold value 1202.

Specifically, when the comparison result Vcomp is greater than the first threshold value 1201, the system controller 102 may provide a user interface including notification information indicating that the LED array 111 needs attention, i.e., an alert notification, at time 1220. Also, when the comparison result Vcomp is greater than the first threshold value 1201, the system controller 102 may reset a time interval of checking the LED array 111. For example, the system controller 102 may reset the time interval from 1 week to 24 hours. Alternatively, the system controller 102 may provide a user interface for resetting the time interval of checking the LED array 111.

Also, when the comparison result Vcomp is greater than the first threshold value 1201, the system controller 102 may adjust an amount of a current flowing through the LED array 111. For example, by increasing the amount of the current flowing through the LED array 111, the system controller 102 may prevent the brightness of the display panel 101 from decreasing.

Also, when the comparison result Vcomp is greater than the second threshold value 1202, the system controller 102 may determine that there is a failure in the LED array 111. Also, the system controller 102 may provide a user interface including a failure notification. For example, the system controller 102 may provide a user interface including notification information indicating the need to check or replace the LED array 111.

According to an exemplary embodiment, the system controller 102 may dynamically change the first threshold value and the second threshold value according to the disposition position of the LED array 111. For example, referring to FIG. 10, the system controller 102 may apply the first threshold value and the second threshold value differently according to whether the LED array 111 is disposed at the center portion or the peripheral portion of the display panel 101.

Also, according to an exemplary embodiment, the system controller 102 may not determine whether the comparison result Vcomp is greater than the first threshold value. In this case, by determining only whether the comparison result Vcomp is greater than the second threshold value, the system controller 102 may provide a user interface including a notification of a failure in the LED array. Also, according to an exemplary embodiment, the user may determine whether to be provided with the user interface. For example, the system controller 102 may also receive a user input indicating that the user desires to omit the alert notification information indicating the need for attention. In this case, by determining only whether the comparison result Vcomp is greater than the second threshold value, the system controller 102 may provide a user interface including a notification of a failure in the LED array.

Also, the system controller 102 may provide the user interface through all or a portion of the display panel 101. Also, the system controller 102 may provide the user interface through another display system communicating with the display system 100.

Although it has been described above with reference to FIGS. 12A and 12B that the system controller 102 receives the output signal Vout representing the sensing voltage Vsen from the display panel 101 and acquires the comparison result Vcomp based on the received output signal Vout, the exemplary embodiments are not limited thereto. For example, as illustrated in FIG. 4, when the detector 113 further includes the comparator 420, the system controller 102 may also receive the comparison result Vcomp between the sensing voltage Vsen and the reference voltage Vref as the output signal Vout.

Figure 13:
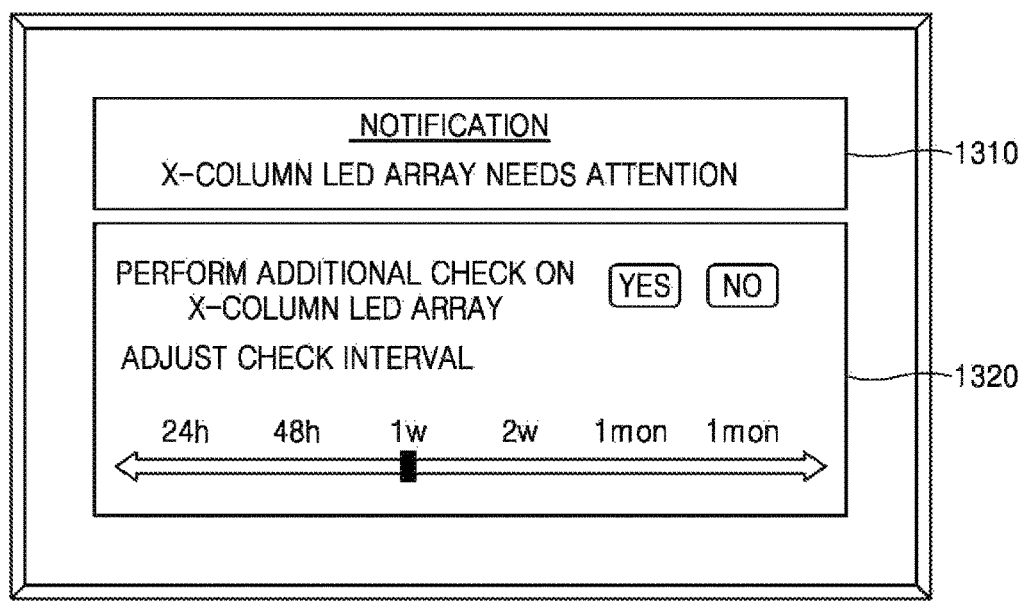
FIG. 13 illustrates an example in which a system controller provides user interfaces.

FIG. 13 illustrates an example in which the system controller 102 provides user interfaces.

Referring to FIG. 13, when the comparison result Vcomp between the sensing voltage Vsen and the reference voltage Vref is greater than the first threshold value 1201 (see FIG.

12B), the system controller 102 may provide a first user interface 1310 including notification information indicating the need for attention to the LED array. For example, the first user interface 1310 may include a text image indicating "X-column LED array needs attention".

Also, the system controller 102 may provide a second user interface 1320 for receiving a user input for determining whether to perform an additional check on the LED array needing attention and a user input for adjusting a check time interval. When receiving the user inputs on the second user interface 1320, the system controller 102 may perform an additional check on the LED array needing attention and may adjust the time interval of checking all the LED array.

Figure 14:
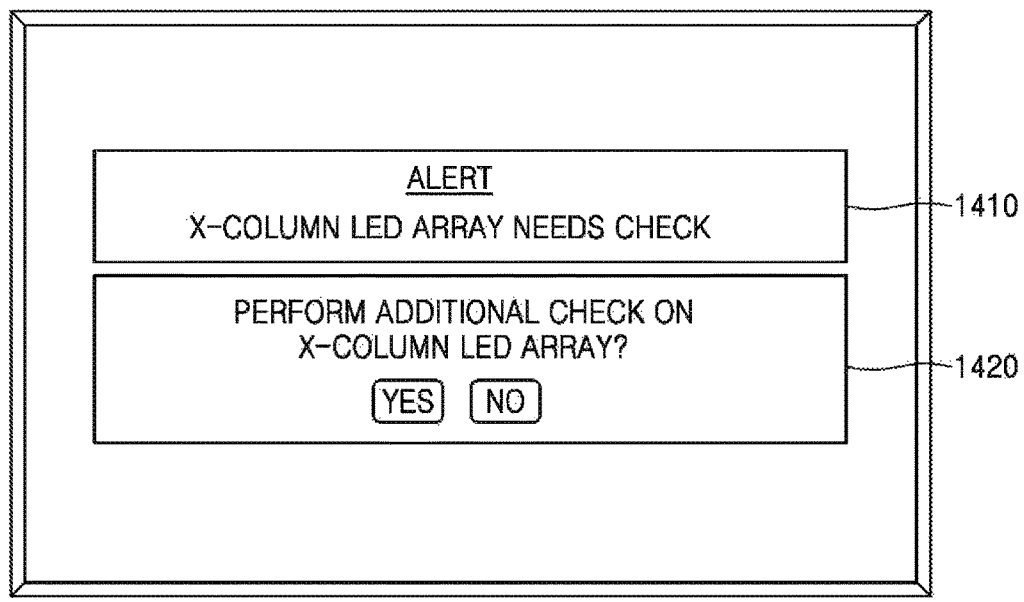
FIG. 14 illustrates another example in which a system controller provides user interfaces.

FIG. 14 illustrates another example in which the system controller 102 provides user interfaces.

Referring to FIG. 14, when the comparison result Vcomp between the sensing voltage Vsen and the reference voltage Vref is greater than the second threshold value 1202 (see FIG. 12B), the system controller 102 may provide a first user interface 1410 including notification information indicating that there is a failure in the LED array. For example, the first user interface 1410 may include a text image indicating "X-column LED array needs check".

Also, the system controller 102 may provide a second user interface 1420 for receiving a user input for determining whether to perform an additional check on the LED array in which a failure is detected. When receiving the user input on the second user interface 1420, the system controller 102 may perform an additional check on the LED array in which a failure is detected.

Figures 15, 16:
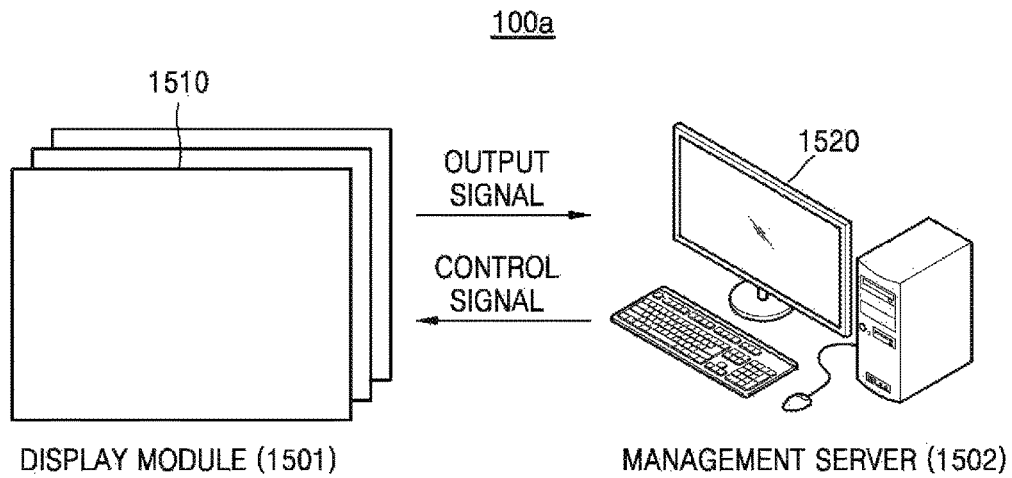
FIG. 15 is a diagram illustrating a display system, according to another exemplary embodiment.
FIG. 16 is a diagram illustrating an operation of a management server for controlling a plurality of display modules, according to an exemplary embodiment.

FIG. 15 is a diagram illustrating a display system, according to another exemplary embodiment.

Referring to FIG. 15, a display system 100*a* may include at least one display module 1501 and a management server 1502 managing the at least one display module 1501. In this case, each display module 1501 may include a display panel 1510 and a communicator unit (not illustrated) for communicating data with the management server 1502 via a wired and/or wireless network. Also, the display panel 1510 may correspond to the display panel 101 of FIG. 3 and may include an LED array (not illustrated), an LED current controller (not illustrated), and a detector (not illustrated).

Also, the management server 1502 may include at least one processor (not illustrated) and may include a communicator unit (not illustrated) for communicating data with the display modules 1501 through a wired/wireless network. Herein, the at least one processor (not illustrated) of the management server 1502 may correspond to the system controller 102 of FIG. 3. Also, the management server 1502 may include a display 1520 for providing a user interface.

Under the control of the management server 1502, each display module 1501 may control the current flowing through the LED arrays included in the display panel 1510. Each display module 1501 may enable the LEDs of the LED array to function as a light-emitting element or a light-receiving element. Also, the management server 1502 may receive the comparison result between the reference voltage and the sensing voltage from the LED arrays from each display module 1501 and determine the failure or not of the display module 1501 based on the received comparison result. An operation of the management server 1502 for determining the failure or not of each display module 1501 may be the same as that in the embodiment described above with reference to FIGS. 3 to 14, and thus detailed descriptions thereof will be omitted herein for conciseness.

According to an exemplary embodiment, a plurality of display modules 1501 may output one piece of image data under the control of the management server 1502. In this case, when at least one of the display modules 1501 is replaced with a new display module, the brightness of the new display module may be greater than the brightness of the unreplaced display module. Thus, one piece of image data may be output in different brightness so as to cause a visual discomfort to the user.

Hereinbelow, a description will be given of an operation of the management server 1502 for performing control such that the display modules 1501 output image data in constant brightness, by estimating the brightness of the display modules 1501 based on a difference in the sensing voltage detected from the LED arrays of the display modules 1501.

FIG. 16 is a diagram illustrating an operation of a management server for controlling a plurality of display modules 1501, according to an exemplary embodiment.

Referring to FIG. 16, the management server 1502 may communicate with first to ninth display modules 1501-1, 1501-2, 1501-3, 1501-4, 1501-5, 1501-6, 1501-7, 1501-8, 1501-9. In this case, when the fifth display module 1501-5 is replaced, the management server 1502 may perform an operation for adjusting the brightness of the fifth display module 1501-5 or the brightness of peripheral display modules.

For example, according to a predetermined pattern, the management server 1502 may perform control such that a current or no current flows through the LED arrays included in the first to ninth display modules 1501-1 to 1501-9. Specifically, the management server 1502 may control an LED current controller (not illustrated) of each display module such that a current or no current flows through each respective LED array. Since the LED current controller (not illustrated) may correspond to the LED current controller 112 of FIG. 3, detailed descriptions thereof will be omitted herein for conciseness. Also, an operation of the management server 1502 for applying a predetermined pattern to the first to ninth display modules 1501-1 to 1501-9 will be described below in detail with reference to FIGS. 17, 18, and 19.

A detector (not illustrated) of each display module may detect a sensing voltage generated in the LED array through which no current flows, and provide an output signal based on the detected sensing voltage to the management server 1502. For example, the detector (not illustrated) may provide a sensing voltage (or an amplified sensing voltage) as an output signal to the management server 1502. Since the detector (not illustrated) may correspond to the detector 113 of FIG. 3, detailed descriptions thereof will be omitted herein for conciseness. Alternatively, the detector (not illustrated) may provide the comparison result between the sensing voltage and the reference voltage to the management server 1502. In this case, the detector (not illustrated) may correspond to the detector 113 of FIG. 4.

The management server 1502 may estimate the brightness of the first to ninth display modules 1501-1 to 1501-9 based on the output signals received from each display module. Also, based on the estimated brightness, the management server 1502 may adjust a respective amount of the current to be provided to each of the LED arrays of each display module. For example, by controlling the LED current controller (not illustrated) of each display module, the management server 1502 may increase the current provided to the LED array of the display module that is estimated to have a low brightness, or decrease the current provided to the LED array of the display module that is estimated to have a high brightness.

FIG. 17 illustrates an example of patterns applied to display modules by a management server.

As illustrated in FIG. 17, the management server 1502 may control the LED current controller (not illustrated) of each the display panel based on a first pattern 1710 and a second pattern 1720.

Specifically, based on the first pattern 1710, as indicated by the unshaded circles shown in the centermost display module by comparison with the shaded circles shown in all of the other display modules, the management server 1502 may perform control such that no current flows through the LED arrays included in the fifth display module 1501-5, and perform control such that a current flows through the LED arrays included in the other display modules 1501-1 to 1501-4 and 1501-6 to 1501-9. Thus, the management server 1502 may receive the sensing voltage detected by the detector (not illustrated) of the fifth display module 1501-5, as a first output signal. In this case, the first output signal may be the sensing voltage detected from the LED arrays disposed at the edge of the fifth display module 1501-5, among the LED arrays of the fifth display module 1501-5.

Also, based on the second pattern 1720, as indicated by the shaded circles shown in the centermost display module by comparison with the unshaded circles shown in all of the other display modules, the management server 1502 may perform control such that a current flows through the LED arrays included in the fifth display module 1501-5, and perform control such that no current flows through the LED arrays included in the other display modules 1501-1 to 1501-4 and 1501-6 to 1501-9. In this case, the management server 1502 may receive the sensing voltage generated by the detector (not illustrated) of each of the peripheral display modules 1501-1 to 1501-4 and 1501-6 to 1501-9 around the fifth display module 1501-5, as a second output signal. In this case, the second output signal may be the sensing voltage detected from the LED arrays adjacent to the fifth display module 1501-5, among the LED arrays included in the peripheral display modules 1501-1 to 1501-4 and 1501-6 to 1501-9 around the fifth display module 1501-5.

Also, the second output signal may be proportional to the brightness of the fifth display module 1501-5, and the first output signal may be proportional to the brightness of the peripheral display modules 1501-1 to 1501-4 and 1501-6 to 1501-9. Thus, the management server 1502 may estimate the brightness difference between the fifth display module 1501-5 and other display modules based on the comparison result between the first output signal and the second output signal. Thus, based on the comparison result between the first output signal and the second output signal, the management server 1502 may perform adjustment such that the first to ninth display modules 1501-1 to 1501-9 have constant brightness.

For example, when the difference between the first output signal and the second output signal is greater than a threshold value, the management server 1502 may control the LED current controller (not illustrated) of the fifth display module 1501-5 to decrease the current provided to the LED arrays of the fifth display module 1501-5. Alternatively, when the difference between the first output signal and the second output signal is greater than a threshold value, the management server 1502 may control the LED current controller (not illustrated) of the display modules 1501-1 to 1501-4 and 1501-6 to 1501-9 other than the fifth display module 1501-5 to increase the current provided to the LED arrays of the other display modules 1501-1 to 1501-4 and 1501-6 to 1501-9.

Figure 18:
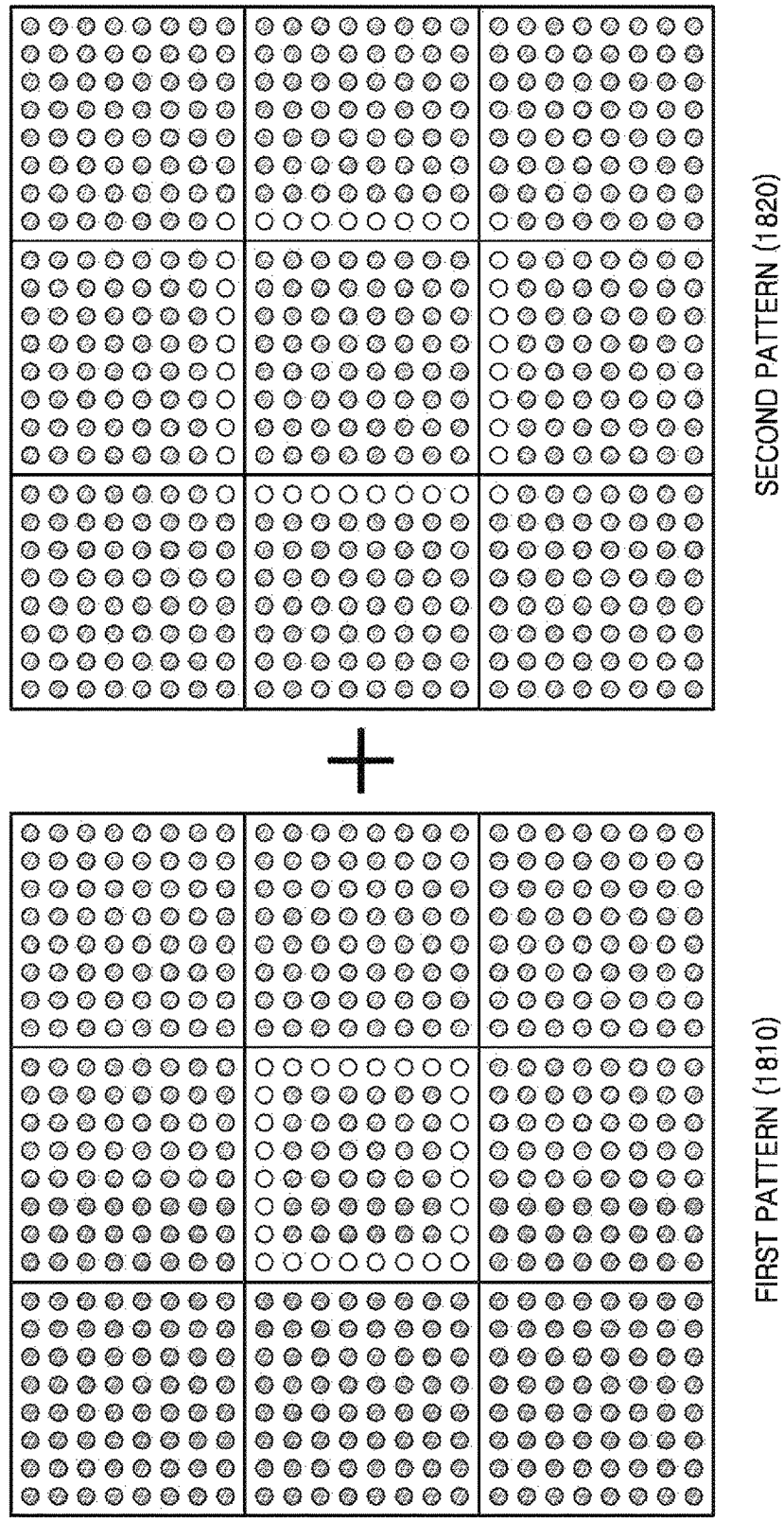
FIG. 18 illustrates another example of patterns applied to display modules by a management server.

FIG. 18 illustrates another example of patterns applied to display modules by a management server.

As illustrated in FIG. 18, the management server 1502 may sequentially apply a first pattern 1810 and a second pattern 1820 to the first to ninth display modules 1501-1 to 1501-9. By controlling the current flowing through the LED arrays located at the edge of the fifth display module 1501-5 replaced with a new one and the LED arrays adjacent thereto, the management server 1502 may perform adjustment such that the display modules 1501-1 to 1501-9 have constant brightness.

Figure 19:
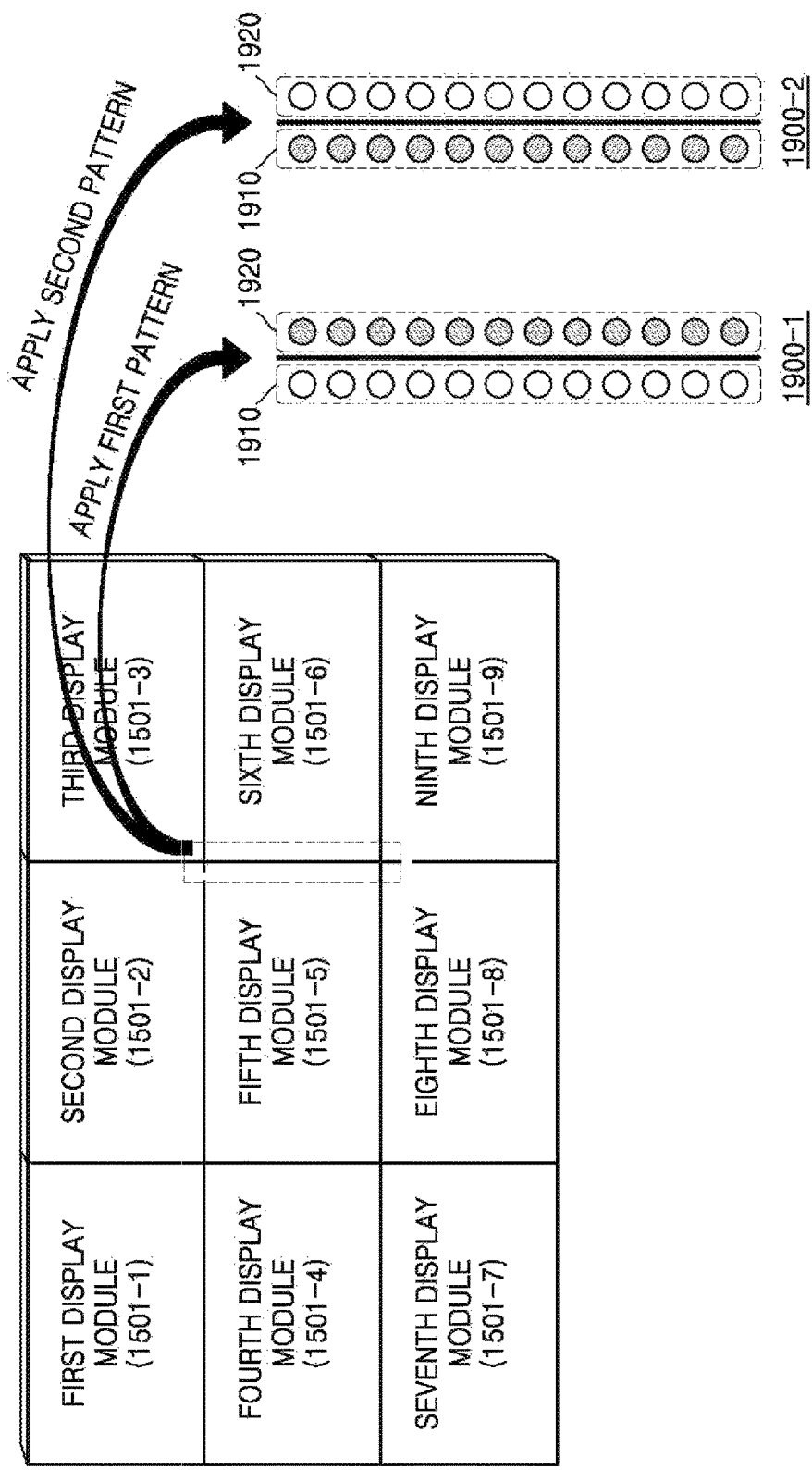
FIG. 19 illustrates an example in which the patterns of FIG. 18 are applied to display modules.

FIG. 19 illustrates an example in which the patterns of FIG. 18 are applied to display modules.

Referring to FIG. 19, based on the first pattern 1810 (see FIG. 18), as indicated by the unshaded circles illustrated along the edges of the centermost display module by comparison with the shaded circles illustrated in the central portions thereof and also in the other display modules, the management server 1502 may perform control such that a current flows through the LED arrays located at the edge of the fifth display module 1501-5. Thereafter, based on the second pattern 1820 (see FIG. 18), the management server 1502 may perform control such that a current flows through the LED arrays adjacent to the fifth display module 1501-5, among the LED arrays of the other display modules 1501-1 to 1501-4 and 1501-6 to 1501-9.

1900-1 and 1900-2 illustrate an operation of a first LED array 1910 located at the edge of the fifth display module 1501-5 and a second LED array 1920 located at the edge of the sixth display module 1501-6, according to the first and second patterns 1810 and 1820. In this case, the first LED array 1910 and the second LED array 1920 may be adjacent to each other.

1900-1 illustrates that a current flows through the first LED array 1910 (i.e., emitting a light, as illustrated by unshaded circles) and no current flows through the second LED array 1920 (i.e., receiving a light, as illustrated by shaded circles), according to the first pattern 1810. In this case, the management server 1502 may receive the first output signal based on the sensing voltage detected from the second LED array 1920 through which no current flows.

1900-2 illustrates that no current flows through the first LED array 1910 (i.e., receiving a light, as illustrated by shaded circles) and a current flows through the second LED array 1920 (i.e., emitting a light, as illustrated by unshaded circles), according to the second pattern 1820. In this case, the management server 1502 may receive the second output signal based on the sensing voltage detected from the first LED array 1910 through which no current flows.

The management server 1502 may estimate the brightness difference between the fifth display module 1501-5 and the sixth display module 1501-6 based on the difference between the first output signal and the second output signal received. The management server 1502 may control the LED current controller (not illustrated) of the fifth display module 1501-5 and the sixth display module 1501-6 based on the estimated brightness difference. Under the control of the management server 1502, the LED current controller (not illustrated) of the fifth and sixth display modules 1501-5 and 1501-6 may adjust the amount of the current provided to the LED arrays of the fifth display module 1501-5, and/or adjust the amount of the current provided to the LED arrays of the sixth display module 1501-6.

In FIG. 19, for the sake of convenience, a description has been provided for only the fifth display module 1501-5 and the sixth display module 1501-6. However, according to the above-described exemplary embodiment, the management server 1502 may perform control such that the first to ninth display modules 1501-1 to 1501-9 output image data in constant brightness, based on the average sensing voltage received from the other display modules 1501-1 to 1501-4 and 1501-6 to 1501-9 and the difference in the sensing voltage received from the fifth display module 1501-5.

Also, those of ordinary skill in the art will easily understand that the above-described exemplary embodiment is not limited to the case where there is a replaced display module, but may also be applied to the case where there are LED arrays having different brightnesses in one display module.

In addition, although it has been described above that the management server 1502 automatically adjusts the amount of the current provided to the LED array of the fifth display module 1501-5 (or the current provided to the LED array of the other display modules 1501-1 to 1501-4 and 1501-6 to 1501-9), the exemplary embodiments are not limited thereto. For example, the management server 1502 may provide a user interface for determining whether to adjust the amount of the current to the user via the display 1520.

Figure 20:
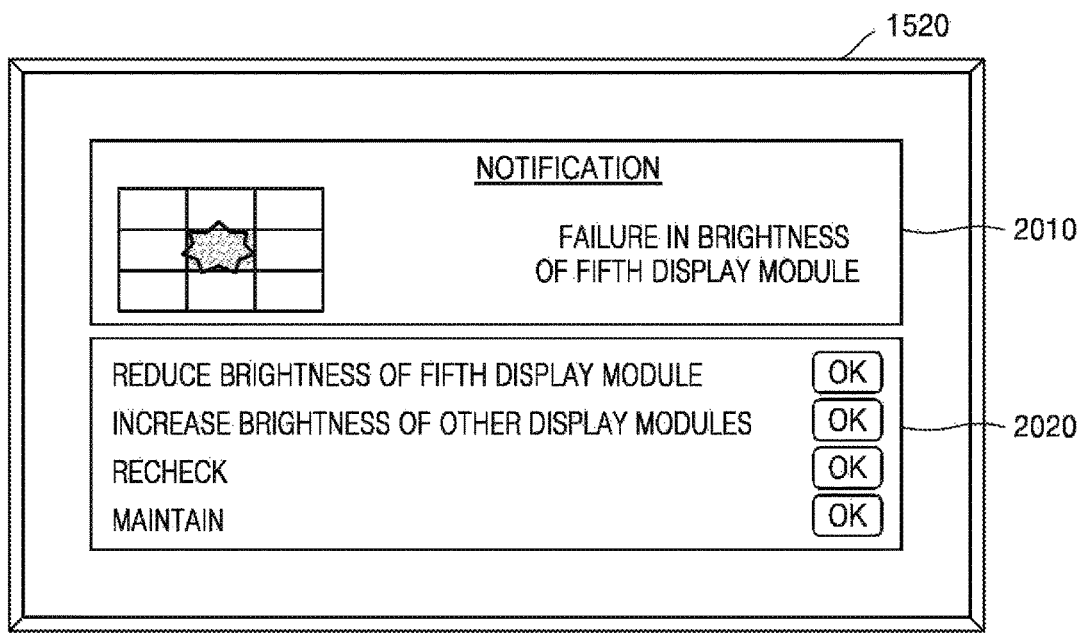
FIG. 20 illustrates an example of user interfaces provided by a management server.

FIG. 20 illustrates an example of user interfaces provided by a management server.

Referring to FIG. 20, the management server 1502 may provide a first user interface 2010 for providing identification information about the display module that is estimated to have different brightness and a second user interface 2020 for receiving a user input for determining whether to adjust the amount of the current of the display modules.

Based on the user input on the second user interface 2020, the management server 1502 may determine whether to adjust the amount of the current of the display modules.

Figure 21:
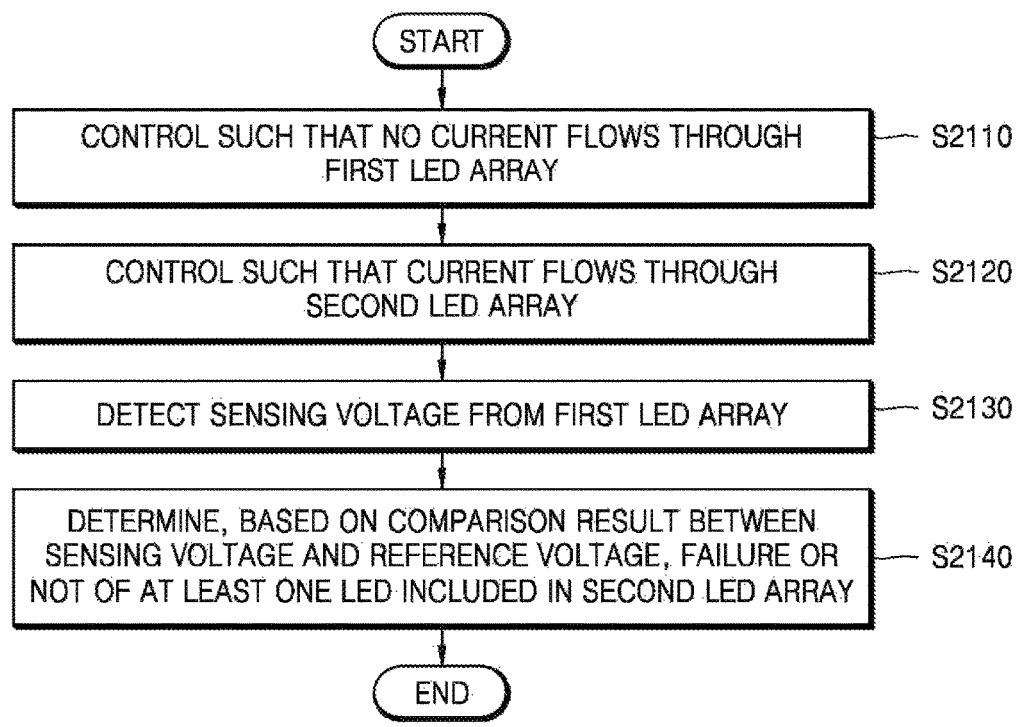
FIG. 21 is a flow diagram illustrating a self-checking method of a display system, according to an exemplary embodiment.
Figure 22:
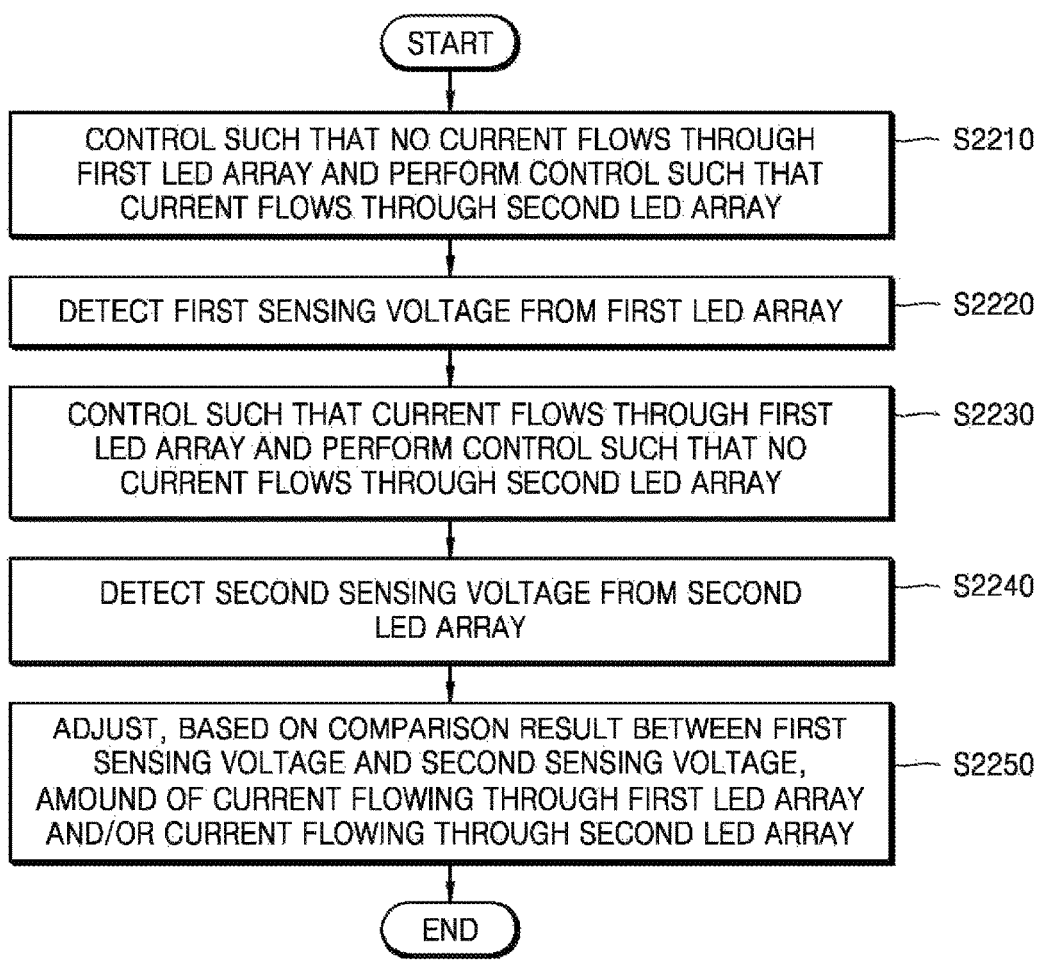
FIG. 22 is a flow diagram illustrating a self-checking method of a display system, according to another exemplary embodiment.

FIGS. 21 and 22 are flow diagrams illustrating self-checking methods of the display system 100, according to exemplary embodiments. The self-checking methods of FIGS. 21 and 22 relate to the above-described exemplary embodiments as described above with reference to FIGS. 1 to 20. Thus, even if omitted below, any descriptions given above with reference to FIGS. 1 to 20 may also be applied to the method of FIGS. 21 and 22.

FIG. 21 is a flow diagram illustrating a self-checking method of the display system 100, according to an exemplary embodiment.

Referring to FIG. 21, the display system 100 may control a current flowing through a plurality of LED arrays including LEDs. In operation S2110, the display system 100 may perform control such that no current flows through the first LED array. For example, by applying a zero bias voltage to the first LED array, the display system 100 may perform control such that no current flows through the first LED array. Alternatively, by applying a reverse bias to the first LED array, the display system 100 may perform control such that no current flows through the first LED array. Thus, at least one LED included in the first LED array may function as a light-receiving element.

In operation S2120, the display system 100 may perform control such that a current flows through the second LED array. For example, the display system 100 may provide a forward bias to the second LED array. Thus, at least one LED included in the second LED array may function as a light-emitting element.

The first LED array and the second LED array may be adjacent to each other. For example, the first LED array and the second LED array may be disposed successively on the display panel 101. However, the exemplary embodiments are not limited thereto, and the first LED array and the second LED array may also be disposed with at least one other LED array therebetween on the display panel 101.

According to an exemplary embodiment, the display system 100 may perform control such that the LEDs included in the second LED array emit light in at least one of red, blue, and green. For example, the display system 100 may perform control to emit a light by only at least one of a red (R) element, a green (G) element, and a blue (B) element constituting the LED.

In operation S2130, the display system 100 may detect the sensing voltage from the first LED array. Herein, the sensing voltage may be a photovoltaic voltage (or photovoltage) caused by the light wave (i.e., light energy) generated by at least one LED included in the second LED array emitting a light. For example, the display system 100 may detect a sensing voltage (e.g., 0.05 V to 0.8 V) in accordance with a potential difference that is generated between an anode and a cathode of the LED included in the first LED array.

In operation S2140, based on the comparison result between the sensing voltage and the reference voltage, the display system 100 may determine the failure or not of at least one LED included in the second LED array.

Herein, the reference voltage may refer to a predetermined value for determining whether the light output from the second LED array through which a current flows (or which emits a light) decreases to a predetermined level or below. Alternatively, the reference voltage may correspond to a previously-detected sensing voltage. Thus, the display system 100 may monitor a brightness change of the LEDs included in the second LED array, based on the output light from the second LED array through which a current flows (or which emits a light).

Also, based on the difference between the sensing voltage and the reference voltage, the display system 100 may determine the failure or not of at least one LED included in the second LED array. The failure or not of the LED may refer to whether the light output of the LED is reduced by more than a certain percentage (e.g., 30%) in comparison with the initial light output.

Also, according to a predetermined pattern, the display system 100 may determine the first LED array through which no current flows (or which receives a light) and the second LED array through which a current flows (or which emits a light). In this case, the pattern may include information about whether to provide a current to the LED arrays included in the display system 100. For example, the pattern may be stored in the form of a set that has as many elements as the number of LED arrays included in the display system 100. Since a method of applying a predetermined pattern by the display system 100 may be the same as that in the exemplary embodiment illustrated in FIGS. 7, 8, and 9, detailed descriptions thereof will be omitted herein for conciseness.

Also, the display system 100 may provide a user interface including notification information, when determining that there is a failure in at least one LED included in the second LED array. For example, the display system 100 may provide a user interface representing the failure level (e.g., a light output decrease of 40%) and position information of the second LED array. Since a method of providing the user interface by the display system 100 may be the same as that in the exemplary embodiment illustrated in FIGS. 12A, 12B, 13, and 14, detailed descriptions thereof will be omitted herein for conciseness.

Alternatively, the display system 100 may perform an additional check, when determining that there is a failure in at least one LED included in the second LED array. For example, the display system 100 may select a particular pattern for individually checking each LED included in the second LED array and perform operations S2110 to S2140 repeatedly according to the selected pattern.

FIG. 22 is a flow diagram illustrating a self-checking method of the display system 100, according to another exemplary embodiment. In this case, the display system 100 may include a plurality of display modules.

Referring to FIG. 22, in operation S2210, the display system 100 may perform control such that no current flows through the first LED array and perform control such that a current flows through the second LED array. In this case, the first LED array and the second LED array may be adjacent to each other.

According to an exemplary embodiment, when at least one of the display modules is replaced with a new display module, the display system 100 may perform a self-checking operation in order to prevent the brightness of the new display module from becoming different from the brightness of the other display modules. Alternatively, when at least one of the display modules is replaced, the display system 100 may perform a checking operation by the user.

For example, referring to FIGS. 18 and 19, based on the first pattern 1810 (see FIG. 18), the display system 100 may determine the first LED array 1910 (see FIG. 19) included in the fifth display module 1501-5 (see FIG. 19) and the second LED array 1920 (see FIG. 19) included in the unreplaced sixth display module 1501-6 (see FIG. 19), perform control such that no current flows through the first LED array 1910, and perform control such that a current flows through the second LED array 1920.

In operation S2220, the display system 100 may detect the first sensing voltage from the first LED array. Thus, the display system 100 may detect the first sensing voltage according to the light wave from the unreplaced sixth display module 1501-6.

In operation S2230, the display system 100 may perform control such that a current flows through the first LED array and perform control such that no current flows through the second LED array. Also, in operation S2240, the display system 100 may detect the second sensing voltage from the second LED array. Thus, the display system 100 may detect the second sensing voltage according to the light wave from the fifth display module 1501-5, which has been replaced.

In operation S2250, based on the comparison result between the first sensing voltage and the second sensing voltage, the display system 100 may adjust the amount of the current flowing through the first LED array and/or the current flowing through the second LED array.

Herein, the first sensing voltage may be proportional to the brightness of the unreplaced sixth display module 1501-6, and the second sensing voltage may be proportional to the brightness of the fifth display module 1501-5, which has been replaced. Thus, the display system 100 may estimate the brightness difference between the fifth display module 1501-5 and the sixth display module 1501-6 based on the difference between the first sensing voltage and the second sensing voltage.

Also, based on the brightness difference between the display modules, the display system 100 may perform adjustment such that the display modules have constant brightness. For example, when the difference between the first sensing voltage and the second sensing voltage is greater than a threshold value, the display system 100 may decrease the current provided to the LED array included in the fifth display module 1501-5. Alternatively, when the difference between the first sensing voltage and the second sensing voltage is greater than a threshold value, the display system 100 may increase the current provided to the LED array included in the sixth display module 1501-6.

Although a description has been presented of a checking method for adjusting the brightness between the different display modules, the exemplary embodiments are not limited thereto. For example, the display system 100 may detect the LED arrays having different brightness in one display module and control the current provided to the detected LED arrays.

The above exemplary embodiments may be written as a program executable by a computer and may be implemented in a general-purpose digital computer that executes the program by using a transitory or non-transitory computer-readable recording medium.

Also, for example, when a processor of the computer needs to communicate with any other remote computer or server in order to execute the above functions, the processor of the computer may further include information about how it may communicate with any other remote computer or server by using a communication module (e.g., wired and/or wireless communication module) of the computer and/or information about which information or media that should transmitted/received for communication.

In addition, for example, a functional program for implementing the above exemplary embodiments, a code and a code segment associated therewith, and the like may be easily inferred or changed by programmers in the art in consideration of the system environment of the computer that reads the recording medium and executes the program.

Examples of the non-transitory computer-readable recording medium may include a ROM, a RAM, a CD-ROM, a magnetic tape, a floppy disk, and an optical media storage device.

Also, the computer-readable recording medium may be distributed over network-coupled computer systems so that a computer-readable code may be stored and executed in a distributed fashion. In this case, at least one of a plurality of distributed computers may execute some of the above functions and transmit the execution results to at least one of the other distributed computers, and the computer receiving the results may also execute some of the above functions and provide the execution results to the other distributed computers.

Although it has been described above that all components constituting the above-described exemplary embodiments are combined into one component or operate in a combined manner, the scope of the present inventive concept is not necessarily limited to the above-described exemplary embodiments. That is, without departing from the scope of the present inventive concept, all the components may also be selectively combined to operate as at least one component. Also, although each of all the components may be implemented as one independent hardware unit, some or all of the respective components may be selectively combined to be implemented as a computer program having a program module performing some or all functions combined in one or more hardware units. The codes and the code segments constituting the computer program may be easily inferred by those of ordinary skill in the art. The computer program may be stored in a computer-readable storage medium and may be read and executed by the computer to implement the above-described exemplary embodiments. Examples of the storage medium of the computer program may include a magnetic recording medium and an optical recording medium.

The spirit of the present inventive concept has been described above merely as examples, and those of ordinary skill in the art will understand that various modifications and changes may be made in the above-described exemplary embodiments without departing from the essential features of the present inventive concept. Thus, the above-described exemplary embodiments do not limit but describe the spirit of the present inventive concept, and the scope of the present inventive concept is not limited by the above-described exemplary embodiments. The scope of the present inventive concept should be defined by the following claims, and all spirits equivalent to the following claims should be construed as falling within the scope of the present inventive concept.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A light-emitting diode (LED) driving system comprising:
    an LED current controller configured to control a current flowing through a plurality of LED arrays, each of the plurality of LED arrays including at least one LED, such that no current flows through a first LED array from among the plurality of the LED arrays and a current flows through a second LED array from among the plurality of the LED arrays;
    a detector configured to detect a sensing voltage from the first LED array; and
    a system controller configured to determine, based on a comparison result between the detected sensing voltage and a reference voltage, a failure of the at least one LED included in the second LED array,
    wherein the sensing voltage comprises a photovoltaic voltage caused by a light wave received from the at least one LED included in the second LED array.

2. The LED driving system of claim 1, wherein the LED current controller comprises a switch configured to control a bias applied to the first LED array and the second LED array.

3. The LED driving system of claim 1, wherein the system controller is further configured to determine the first LED array and the second LED array from among the plurality of the LED arrays according to a predetermined pattern.

4. The LED driving system of claim 1, wherein the system controller is spaced apart from the LED current controller and the detector.

5. The LED driving system of claim 1, wherein the detector comprises a comparator configured to output the comparison result based on a difference between the detected sensing voltage and the reference voltage.

6. The LED driving system of claim 5, wherein the comparator comprises an amplifier, and
    wherein the amplifier comprises a first input terminal configured to receive the sensing voltage and a second input terminal configured to receive the reference voltage, and
    wherein the amplifier is configured to output an amplified comparison result by amplifying the difference between the received sensing voltage and the reference voltage.

7. The LED driving system of claim 1, wherein the reference voltage comprises a previously-detected sensing voltage.

8. The LED driving system of claim 1, wherein the system controller is further configured to provide a user interface which includes notification information in response to the failure of the at least one LED included in the second LED array.

9. The LED driving system of claim 1, wherein the LED current controller is further configured to control the at least one LED included in the second LED array to emit at least one from among a red light, a green light, a blue light, and any combination thereof.

10. A light-emitting diode (LED) checking method which is implemented in an LED driving system, the LED checking method comprising:
    controlling a current flow such that no current flows through a first LED array comprising at least one LED and such that a current flows through a second LED array comprising at least one LED;
    detecting a first sensing voltage from the first LED array;
    after the detecting the first sensing voltage, controlling the current flow such that a current flows through the first LED array and such that no current flows through the second LED array;
    detecting a second sensing voltage from the second LED array; and
    adjusting at least one from among an amount of the current flowing through the first LED array and an amount of the current flowing through the second LED array, based on a comparison result between the detected first sensing voltage and the detected second sensing voltage.

11. A light-emitting diode (LED) driving system comprising:
    a first LED array comprising at least one LED;
    a second LED array comprising at least one LED;
    an LED current controller configured to control an amount of a current flowing through the first LED array and an amount of a current flowing through the second LED array; and
    a detector configured to detect a first sensing voltage from the first LED array when no current flows through the first LED array, and to detect a second sensing voltage from the second LED array when no current flows through the second LED array,
    wherein the LED current controller is further configured to adjust at least one from among the amount of the current flowing through the first LED array and the amount of the current flowing through the second LED array, based on a comparison result between the detected first sensing voltage and the detected second sensing voltage.

12. A light-emitting diode (LED) checking method which is implemented in an LED driving system, the LED checking method comprising:
    controlling a current flowing through a plurality of LED arrays, each of the plurality of LED arrays including at least one LED, such that no current flows through a first LED array from among the plurality of the LED arrays and a current flows through a second LED array from among the plurality of the LED arrays;
    detecting a sensing voltage from the first LED array; and
    determining, based on a comparison result between the detected sensing voltage and a reference voltage, a failure of the at least one LED included in the second LED array, wherein the sensing voltage comprises a photovoltaic voltage caused by a light wave received from the at least one LED included in the second LED array.

13. The LED checking method of claim 12, wherein the controlling the current flowing through the plurality of the LED arrays comprises applying a zero bias voltage to the first LED array.

14. A non-transitory computer-readable recording medium that stores a program that performs the LED checking method of claim 12 when executed by a computer.

15. The LED checking method of claim 12, wherein the reference voltage comprises a previously-detected sensing voltage.

16. The LED checking method of claim 12, further comprising monitoring a brightness change of the at least one LED included in the second LED array, based on the comparison result.

17. The LED checking method of claim 12, further comprising providing a user interface which includes notification information in response to the failure in the at least one LED included in the second LED array.

18. The LED checking method of claim 12, wherein the controlling the current flowing through the plurality of the LED arrays further comprises controlling the at least one LED included in the second LED array to emit at least one from among a red light, a green light, a blue light, and any combination thereof.

* * * * *